United States Patent
Tanaka

(10) Patent No.: US 10,763,854 B2
(45) Date of Patent: Sep. 1, 2020

(54) SEMICONDUCTOR INTEGRATED CIRCUIT

(71) Applicant: Fuji Electric Co., Ltd., Kanagawa (JP)

(72) Inventor: Takahide Tanaka, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/672,797

(22) Filed: Nov. 4, 2019

(65) Prior Publication Data
US 2020/0177180 A1 Jun. 4, 2020

(30) Foreign Application Priority Data

Nov. 29, 2018 (JP) ................. 2018-224137

(51) Int. Cl.
*H03K 17/687* (2006.01)
*H01L 29/78* (2006.01)
*H01L 29/10* (2006.01)
*H03K 3/356* (2006.01)

(52) U.S. Cl.
CPC ..... *H03K 17/6871* (2013.01); *H01L 29/1033* (2013.01); *H01L 29/1095* (2013.01); *H01L 29/7816* (2013.01); *H03K 3/356* (2013.01); *H03K 2217/0063* (2013.01)

(58) Field of Classification Search
CPC ............. H03K 17/6871; H03K 3/356; H03K 2217/0063; H01L 29/1033; H01L 29/1095; H01L 29/7816
USPC ........................................................ 327/333
See application file for complete search history.

(56) References Cited

U.S. PATENT DOCUMENTS

| 10,249,623 B2* | 4/2019 | Tanaka | H01L 29/866 |
| 10,367,056 B2* | 7/2019 | Tanaka | H01L 27/0922 |
| 2012/0235712 A1* | 9/2012 | Yamaji | H01L 29/0646 327/109 |
| 2015/0021711 A1* | 1/2015 | Jonishi | H01L 27/0285 257/401 |
| 2015/0236013 A1* | 8/2015 | Yamaji | H03K 17/18 257/296 |
| 2016/0006427 A1* | 1/2016 | Jonishi | H01L 27/0629 327/109 |

(Continued)

FOREIGN PATENT DOCUMENTS

| JP | 4574601 B2 | 11/2010 |
| JP | 5061597 B2 | 10/2012 |

(Continued)

*Primary Examiner* — Ryan Jager
(74) *Attorney, Agent, or Firm* — Chen Yoshimura LLP

(57) ABSTRACT

A semiconductor integrated circuit includes a level shifter formed in a portion of a high-voltage junction termination structure and an isolation region formed surrounding the periphery of the level shifter. The level shifter includes a p-type base region formed in an upper portion of a p⁻ substrate, an n⁻ source region formed contacting the base region, an n⁺ drift region formed contacting the base region, a drain region formed in an upper portion of the drift region, and a control electrode that controls the voltage of the base region. In a planar pattern, an effective channel width defined by the width of the base region in a portion that overlaps with the control electrode is greater than the width of the drain region as measured along the same direction as the effective channel width.

14 Claims, 16 Drawing Sheets

(56) References Cited

U.S. PATENT DOCUMENTS

| | | | | |
|---|---|---|---|---|
| 2016/0308534 A1* | 10/2016 | Yamaji | .................... | H01L 21/76 |
| 2019/0157450 A1* | 5/2019 | Yamaji | .................. | H01L 21/761 |
| 2019/0189610 A1* | 6/2019 | Tanaka | ................... | H03K 17/00 |

FOREIGN PATENT DOCUMENTS

| | | |
|---|---|---|
| JP | 5293831 B2 | 9/2013 |
| JP | 2015-173255 A | 10/2015 |

* cited by examiner

SEMICONDUCTOR INTEGRATED CIRCUIT

BACKGROUND OF THE INVENTION

Technical Field

The present invention relates to a semiconductor integrated circuit and more particularly to a power semiconductor integrated circuit.

Background Art

A high-voltage integrated circuit (HVIC) is constituted by a low-side circuit region and a high-side circuit region. Below, the reference voltage for the low-side circuit region will be referred to as a "GND voltage", and the reference voltage for the high-side circuit region, which is higher than the GND voltage, will be referred to as a "VS voltage". The HVIC has a feature for converting an input signal which is referenced to the GND voltage to a signal which is referenced to the VS voltage and outputting the resulting signal. This feature makes it possible to drive the gate of a switching device in the upper arm of a half-bridge circuit, for example.

Achieving this feature requires a high-voltage junction termination (HVJT) structure which electrically isolates the high-side circuit region and the low-side circuit region as well as a level shifter which transmits signals between the high-side circuit region and the low-side circuit region. The level shifter is a high-breakdown voltage n-type MOS transistor, for example. Methods of forming level shifters can be largely divided into two groups: wire bonding (WB) schemes and self-shielding (SS) schemes. In WB schemes, the HVJT structure and level shifter are formed separately, and the necessary connections are formed using wire bonding.

Meanwhile, in SS schemes, the level shifter is formed in a region within the HVJT structure, and the level shifter is isolated from the high-side circuit region with a p-type isolation region. SS schemes can be further divided into schemes in which the level shifter is surrounded by a p-type isolation region (hereinafter, "divided SS schemes") and schemes in which the high-side circuit region is surrounded by a p-type isolation region (hereinafter, "non-divided SS schemes").

In recent years, there has been demand for HVICs to support higher driving frequencies. However, driving at higher frequencies results in an increase in heat generation, and therefore there is demand for reduced current-carrying capability in level shifters (which are the largest source of heat generation in HVICs). At the same time, reducing the current-carrying capability of a level shifter increases the time required for signals to be transmitted (the propagation delay time). Therefore, in level shifters there is a trade-off between heat generation and propagation delay time.

Patent Document 1 discloses a method of reducing parasitic capacitance by using a p-type isolation region to divide a WB level shifter into two regions. Patent Document 2 discloses a method of dividing a level shifter into smaller units and arranging these units to improve the heat dissipation and reduce the heat generation of each unit. Patent Document 3 discloses a method of forming an SS level shifter. Patent Document 4 discloses a non-divided SS configuration. However, none of Patent Documents 1 to 4 discuss methods of improving the trade-off between heat generation and delay time in level shifters.

RELATED ART DOCUMENTS

Patent Documents

Patent Document 1: Japanese Patent No. 5293831
Patent Document 2: Japanese Patent No. 5061597
Patent Document 3: Japanese Patent No. 4574601
Patent Document 4: Japanese Patent Application Laid-Open Publication No. 2015-173255

SUMMARY OF THE INVENTION

In light of the problems described above, the present invention aims to provide a semiconductor integrated circuit that can improve the trade-off between heat generation and propagation delay time in a level shifter in an HVIC.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides: a semiconductor integrated circuit, comprising: a high-side circuit region; a high-voltage junction termination structure formed in a ring shape in an area surrounding the high-side circuit region in a plan view; a level shifter formed in a portion of the high-voltage junction termination structure; and an isolation region that is formed surrounding a periphery of the level shifter and that electrically isolates the high-side circuit region from the level shifter, wherein the level shifter includes: a base region of a first conductivity type formed in an upper portion of a semiconductor substrate of the first conductivity type, an impurity concentration of the base region being higher than that of the substrate; a first main electrode contact region of a second conductivity type formed contacting the base region in an upper portion of the substrate, the second conductivity type being different from the first conductivity type; a drift region of the second conductivity type formed contacting the base region in an upper portion of the substrate at a side opposite to a side of the first main electrode contact region in the plan view; a second main electrode contact region of the second conductivity type formed in an upper portion of the drift region, the second main electrode contact region being positioned facing the first main electrode contact region in the plan view; and a control electrode arranged over the base region at a position between the first and second main electrode contact regions in the plan view, so as to control a surface potential of the base region underneath, and wherein in the plan view, an effective channel width defined by a length of the base region that is directly under the control electrode, as measured along a line perpendicular to a channel current direction, is greater than a width of the second main electrode contact region as measured along a line parallel to said line along which the effective channel width is defined.

In another aspect, the present disclosure provides a semiconductor integrated circuit, comprising: a high-side circuit region; a high-voltage junction termination structure formed in a ring shape in an area surrounding the high-side circuit region in a plan view; a level shifter formed in a portion of the high-voltage junction termination structure; and an isolation region that is formed surrounding a periphery of the high-side circuit region and that electrically isolates the high-side circuit region from the level shifter, wherein the level shifter includes: a base region of a first conductivity type formed in an upper portion of a semiconductor substrate of the first conductivity type, an impurity concentration of the base region being higher than that of the substrate; a first main electrode contact region of a second conductivity type formed contacting the base region in an upper portion of the substrate, the second conductivity type being different from the first conductivity type; a drift region of the second conductivity type formed contacting the base region in an upper portion of the substrate at a side opposite to a side of the first main electrode contact region in the plan view; a second main electrode contact region of the second conductivity type formed in an upper portion of the drift region, the second main electrode contact region being positioned facing the first main electrode contact region in the plan view; and a control electrode arranged over the base region, at a position between the first and second main electrode contact regions in the plan view, so as to control a surface potential of the base region underneath, and wherein in the plan view, an effective channel width defined by a length of the base region that is directly under the control electrode, as measured along a line perpendicular to a channel current direction, is less than a width of the second main electrode contact region as measured along a line parallel to said line along which the effective channel width is defined.

The present invention makes it possible to provide a semiconductor integrated circuit that can improve the trade-off between heat generation and propagation delay time in a level shifter in an HVIC.

It is to be understood that both the foregoing general description and the following detailed description are exemplary and explanatory, and are intended to provide further explanation of the invention as claimed.

DETAILED DESCRIPTION OF EMBODIMENTS

Figure 1:
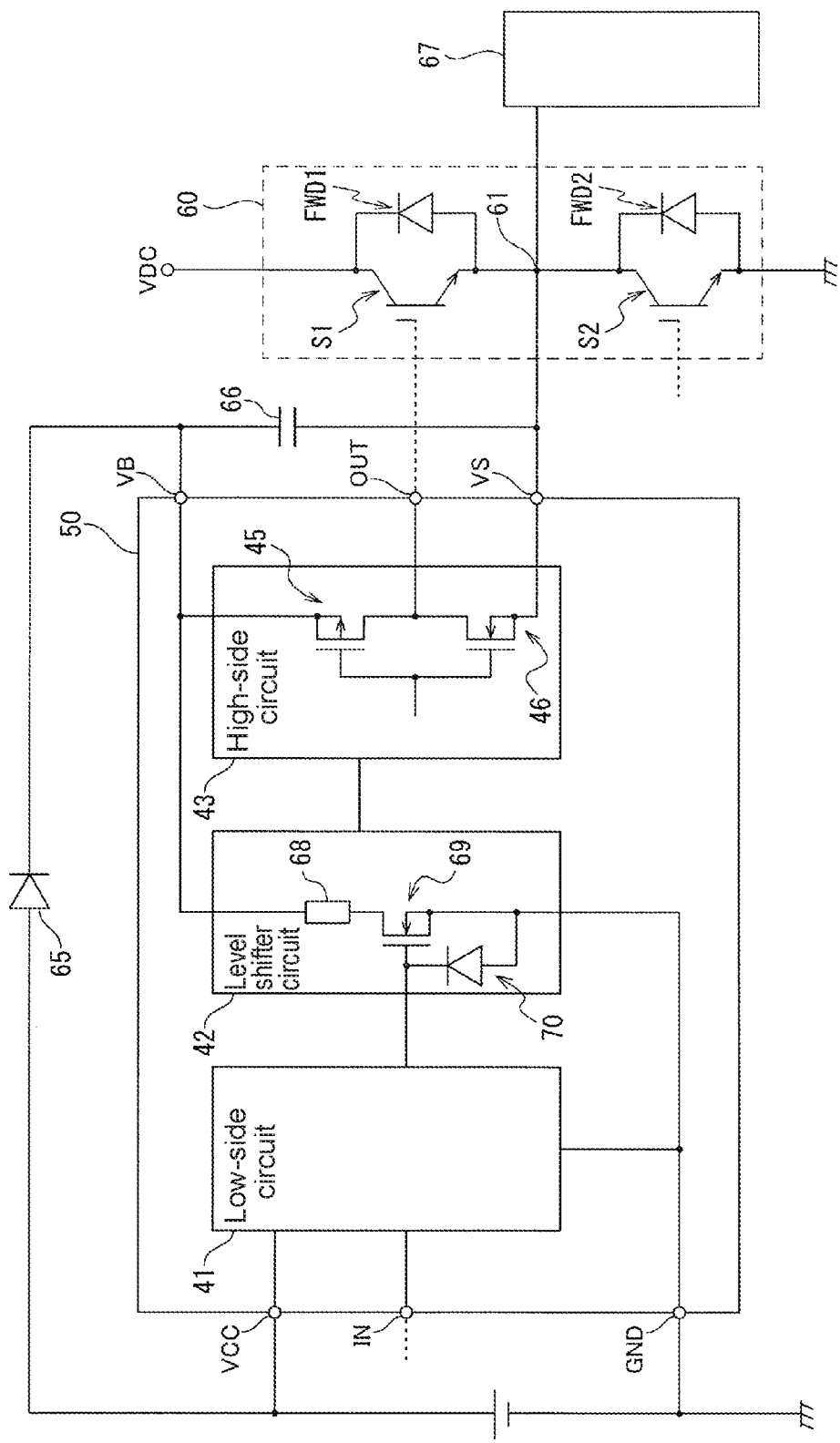
FIG. 1 is a circuit diagram illustrating an example of a semiconductor integrated circuit according to Embodiment 1 of the present invention.

Next, Embodiments 1 and 2 of the present invention will be described with reference to figures. In the following descriptions of the figures, the same or similar reference characters will be used for components that are the same or similar, and redundant descriptions will be omitted. However, the figures are only intended to be schematic illustrations, and the relationships between thickness and planar dimensions, the proportions between the thicknesses of each layer, and the like may be different from in the actual devices. Similarly, the illustrated dimensional relationships and proportions of components in the figures may differ from one figure to the next. Moreover, the embodiments described below are only examples of devices or methods for implementing the technical concepts of the present invention, and the technical concepts of the present invention do not limit the component part materials, shapes, structures, arrangements, or the like to those presented below.

In the present specification, the term "first main electrode region" (or "first main electrode contact region") refers to one semiconductor region among the source region and the drain region in a field-effect transistor (FET) or a static induction transistor (SIT). In an insulated-gate bipolar transistor (IGBT), this term refers to one semiconductor region among the emitter region and the collector region. Moreover, in a static induction (SI) thyristor or gate turn-off (GTO) thyristor, this term refers to one semiconductor region among the anode region and the cathode region. Furthermore, in a FET or a SIT, the term "second main electrode region" (or "second main electrode contact region") refers to the semiconductor region among the source region and the drain region that is not the first main electrode region. In an IGBT, this term refers to the region among the emitter region and the collector region that is not the first main electrode region. In an SI thyristor or GTO thyristor, this term refers to the region among the anode region and the cathode region that is not the first main electrode region. Thus, if the first main electrode region is the source region, then the second main electrode region is the drain region. Similarly, if the first main electrode region is the emitter region, then the second main electrode region is the collector region. Likewise, if the first main electrode region is the anode region, then the second main electrode region is the cathode region. If the bias relationships are interchanged in a FET or the like, the function of the first main electrode region and the function of the second main electrode region can be interchanged. Furthermore, in the present specification, the term "main electrode region" by itself refers in a general manner to either the first main electrode region or the second main electrode region.

In addition, the term "control electrode" refers to the gate electrode of a FET, SIT, IGBT, SI thyristor or GTO thyristor and has the function of controlling the flow of a primary current that flows between the first main electrode region and the second main electrode region.

Moreover, in the following descriptions, directions such as "up" and "down" are defined only for the purposes of convenience and do not limit the technical concepts of the present invention in any way. For example, when an object is viewed rotated by 90°, up and down become left and right, and when an object is viewed rotated by 180°, up and down are inverted.

Furthermore, in the following descriptions, the embodiments are described for a case in which a "first conductivity type" is p-type and a "second conductivity type" is n-type as an example. However, the relationship between the conductivity types can be selected in reverse such that the first conductivity type is n-type and the second conductivity type is p-type. In addition, the symbols "+" and "−" are appended to the letters "n" and "p" to indicate that the corresponding semiconductor region has a higher or lower impurity concentration, respectively, than a semiconductor region for which the symbols + and − are not appended to the letters n and p. However, even when two semiconductor regions are both labeled "n", this does not mean that the respective semiconductor regions have exactly the same impurity concentration. Moreover, it should be technically and logically apparent that components or regions designated as being of the first conductivity type or of the second conductivity type in the following descriptions are components or regions that are made of a semiconductor material, even if not explicitly described as such.

Embodiment 1

As illustrated in FIG. 1, a semiconductor integrated circuit 50 according to Embodiment 1 of the present invention is an HVIC which drives a power converter 60 which is one phase of a power conversion bridge circuit as a drive target, for example. In the power conversion unit 60, a high-side switching device S1 and a low-side switching device S2 are connected in series to form an output circuit.

In FIG. 1, although the high-side switching device S1 and the low-side switching device S2 are respectively depicted as being IGBTs as an example, the high-side switching device S1 and the low-side switching device S2 are not limited to being IGBTs and may be another type of power switching device such as MOSFETs. FIG. 1 depicts an equivalent circuit in which a freewheeling diode FWD1 is connected in anti-parallel to the high-side switching device S1 and a freewheeling diode FWD2 is connected in anti-parallel to the low-side switching device S2. In reality, reverse-conducting IGBT configurations in which the high-side switching device S1 and the freewheeling diode FWD1 are integrated together on a single chip and the low-side switching device S2 and the freewheeling diode FWD2 are integrated together on a single chip may be used.

The high-side switching device S1 and the low-side switching device S2 are connected in series between a high-voltage main power supply VDC (a positive electrode side) and a ground (GND) voltage (a negative electrode side) relative to the main power supply VDC) to form a half-bridge circuit. The high-side electrode terminal (collector terminal) of the high-side switching device S1 is connected to the main power supply VDC, and the low-side electrode terminal (emitter terminal) of the low-side switching device S2 is connected to the GND voltage. A node 61 between the low-side electrode terminal (emitter terminal) of the high-side switching device S1 and the high-side electrode terminal (collector terminal) of the low-side switching device S2 is an output node of the power converter 60 which is one phase of the power conversion bridge circuit. A load 67 such as a motor is connected to the node 61, and a VS voltage of a reference voltage terminal VS is supplied to the load 67.

The semiconductor integrated circuit 50 according to Embodiment 1, in accordance with an input signal from an input terminal IN, outputs a drive signal for switching the gate of the high-side switching device S1 ON and OFF from an output OUT. The semiconductor integrated circuit 50 according to Embodiment 1 includes as at least one circuit a low-side circuit 41, a level shifter circuit 42, a high-side circuit 43, or the like. The low-side circuit 41, the level shifter circuit 42, and the high-side circuit 43 may be monolithically integrated on a single semiconductor chip (semiconductor substrate), for example. Alternatively, the devices constituting the low-side circuit 41, the level shifter circuit 42, and the high-side circuit 43 may be integrated in a hybrid manner divided among two or more semiconductor chips.

The low-side circuit 41 operates using a GND voltage applied to a ground terminal GND as a reference voltage and using a VCC voltage applied to a low-side power supply terminal VCC as a supply voltage. The low-side circuit 41, in accordance with an input signal from the input terminal IN, generates a low-side-level ON/OFF signal and outputs this signal to the level shifter circuit 42. Although this is not illustrated in the figure, the low-side circuit 41 may include a complementary MOS (CMOS) circuit constituted by an NMOS transistor and a PMOS transistor, for example.

The level shifter circuit 42 operates using the GND voltage applied to the ground terminal GND as a reference voltage. The level shifter circuit 42 converts the low-side-level ON/OFF signal from the low-side circuit 41 to a high-side-level ON/OFF signal for use on the high side. The level shifter circuit 42 includes a level shifter 69 constituted by an NMOS transistor or the like, for example. A gate terminal G of the level shifter 69 is connected to the low-side circuit 41, while a source terminal S of the level shifter 69 is connected to the ground terminal GND and a drain terminal D of the level shifter 69 is connected to an input terminal of the high-side circuit 43. One end of a level shift resistor 68 is connected to the drain terminal D of the level shifter 69, and the other end of the level shift resistor 68 is connected to a power supply terminal VB. A protective diode 70 is connected between the gate and source of the level shifter 69.

The high-side circuit 43 operates using the VS voltage applied to the reference voltage terminal VS as a reference voltage and using a VB voltage applied to the high-side power supply terminal VB as a supply voltage. The high-side circuit 43, in accordance with the ON/OFF signal from the level shifter circuit 42, outputs a drive signal from the output terminal OUT in order to drive the gate of the high-side switching device S1. The high-side circuit 43 includes, in an output stage, a CMOS circuit constituted by an NMOS transistor 46 as an active component and a PMOS transistor 45 as an active component, for example. The source terminal of the PMOS transistor 45 is connected to the high-side power supply terminal VB. The source terminal of the NMOS transistor 46 is connected to the reference voltage terminal VS. The output terminal OUT is connected to between the drain terminal of the PMOS transistor 45 and the drain terminal of the NMOS transistor 46.

The semiconductor integrated circuit 50 according to Embodiment 1 has a bootstrap circuit configuration, for example. In the example configuration illustrated in FIG. 1, a bootstrap diode 65 is connected as an external device between the low-side power supply terminal VCC and the high-side power supply terminal VB. Moreover, a bootstrap capacitor 66 is connected as an external device between the high-side power supply terminal VB and the reference voltage terminal VS. The bootstrap diode 65 and the bootstrap capacitor 66 form part of a power supply circuit for driving the high-side switching device S1.

The VB voltage is the maximum voltage applied to the semiconductor integrated circuit 50, and, during normal states in which there are no effects from noise, is maintained to be approximately 15V higher than the VS voltage by the bootstrap capacitor 66. Due to the high-side switching device S1 and the low-side switching device S2 being switched ON and OFF in a complementary manner, the VS voltage repeatedly increases and decreases between a high-side voltage of the main power supply VDC (approximately 400V to 600V, for example) and a low-side voltage (the GND voltage), thus fluctuating from 0V to several hundred volts. Note that there are also cases in which the VS voltage takes a negative voltage.

Figure 2:
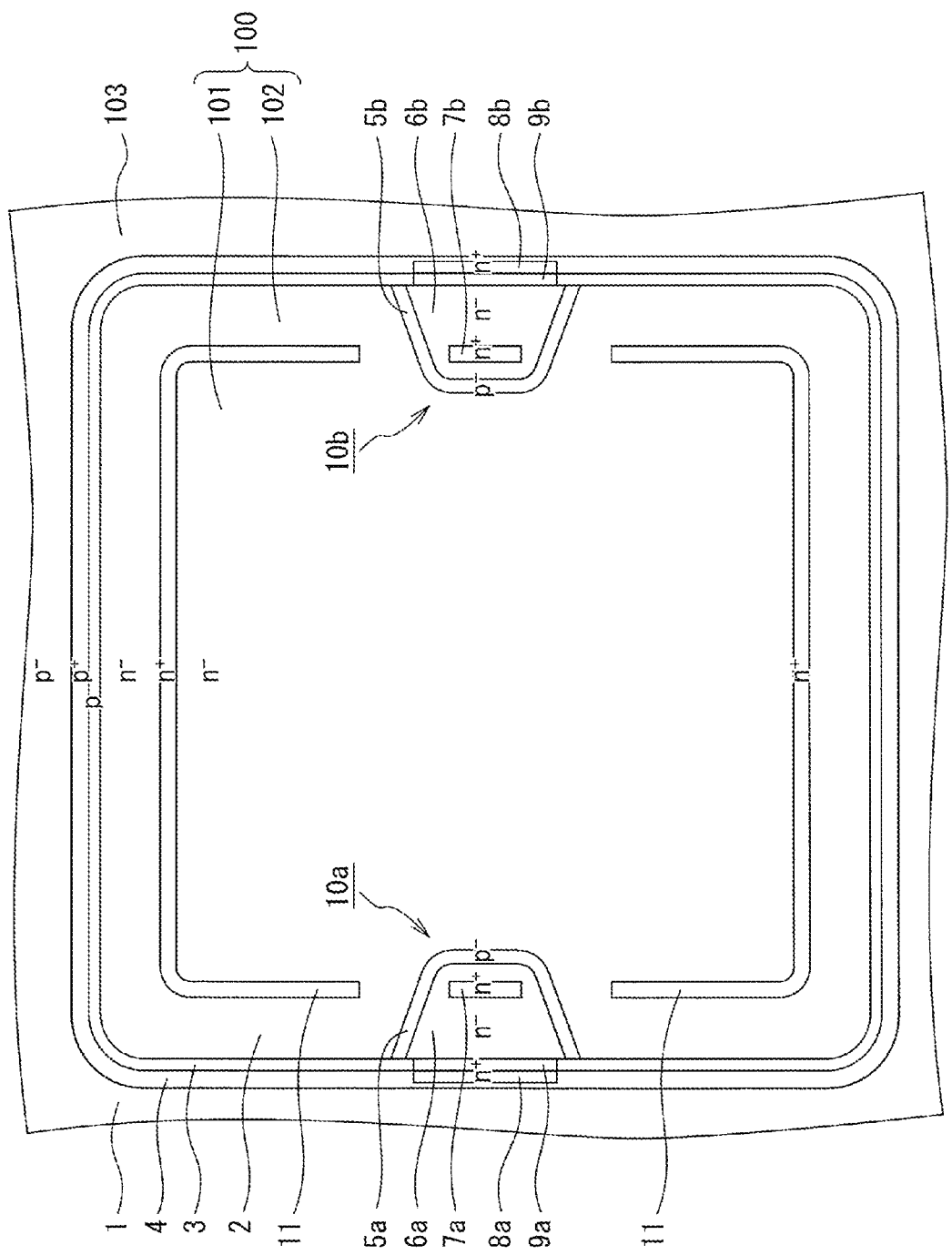
FIG. 2 is a plan view illustrating the example of the semiconductor integrated circuit according to Embodiment 1 of the present invention.

FIG. 2 illustrates the planar layout of a portion of the semiconductor integrated circuit 50 according to Embodiment 1. In Embodiment 1, the semiconductor integrated circuit 50 will be described as including, on a single chip, a high-side circuit portion 100 and a low-side circuit region 103 arranged in an area surrounding the high-side circuit portion 100. The high-side circuit portion 100 includes a high-side circuit region 101 and a high-voltage junction termination (HVJT) structure 102 arranged in a ring shape in an area surrounding the high-side circuit region 101. The high-side circuit region 101 corresponds to the high-side circuit 43 in FIG. 1. The low-side circuit region 103 corresponds to the low-side circuit 41 in FIG. 1. In FIG. 2, the devices respectively included in the high-side circuit region 101 and the low-side circuit region 103 are not illustrated.

As illustrated in FIG. 2, the high-side circuit region 101 has a substantially rectangular planar pattern. In the high-side circuit region 101, a well region 2 of a second conductivity type ($n^-$) is formed in the upper portion of a substrate 1 of a first conductivity type ($p^-$). The substrate 1 can be constituted by a semiconductor substrate made of $p^-$ silicon (Si). Alternatively, the substrate 1 may be constituted by a $p^-$ semiconductor substrate and a $p^-$ epitaxial layer formed on the semiconductor substrate. The substrate 1 may be electrically connected to the ground terminal GND to which the GND voltage is applied.

In an area surrounding the high-side circuit region 101, an $n^+$ contact region 11 is formed in a ring shape in an upper portion of the well region 2. The contact region 11 is electrically connected to the high-side power supply terminal VB illustrated in FIG. 1 to which the VB voltage is applied. The HVJT structure 102 electrically isolates the high-side circuit region 101 from the low-side circuit region 103. A p-type base region 3 is formed in a ring shape in an area surrounding the HVJT structure 102. Along the outer periphery of the base region 3, a $p^+$ base contact region 4 is formed in a ring shape contacting the base region 3. The base contact region 4 is electrically connected to the ground terminal GND to which the GND voltage is applied.

In portions of the HVJT structure 102, a first level shifter 10a and a second level shifter 10b are respectively formed at symmetric positions (here, at line-symmetric positions as well as point-symmetric positions) so as to face one another. Note that the arrangement positions of the first level shifter 10a and the second level shifter 10b are not limited to being symmetric positions, and these components can be formed in any portion of the HVJT structure 102. The first level shifter 10a and the second level shifter 10b correspond to the level shifter 69 which is schematically illustrated as a single NMOS transistor in FIG. 1. The first level shifter 10a and the second level shifter 10b may be individually constituted by an NMOS transistor that turns ON when the input signal is an ON signal and an NMOS transistor that turns ON when the input signal is an OFF signal.

A $p^-$ first isolation region 5a and second isolation region 5b are formed in areas surrounding the first level shifter 10a and the second level shifter 10b. The first isolation region 5a surrounds the periphery of the first level shifter 10a, and the ends of the first isolation region 5a contact the base region 3. The second isolation region 5b surrounds the periphery of the second level shifter 10b, and the ends of the second isolation region 5b contact the base region 3. In other words, the first level shifter 10a and the second level shifter 10b are formed in a divided SS configuration in which the peripheries thereof are respectively surrounded by the $p^-$ first isolation region 5a and second isolation region 5b.

Figure 3:
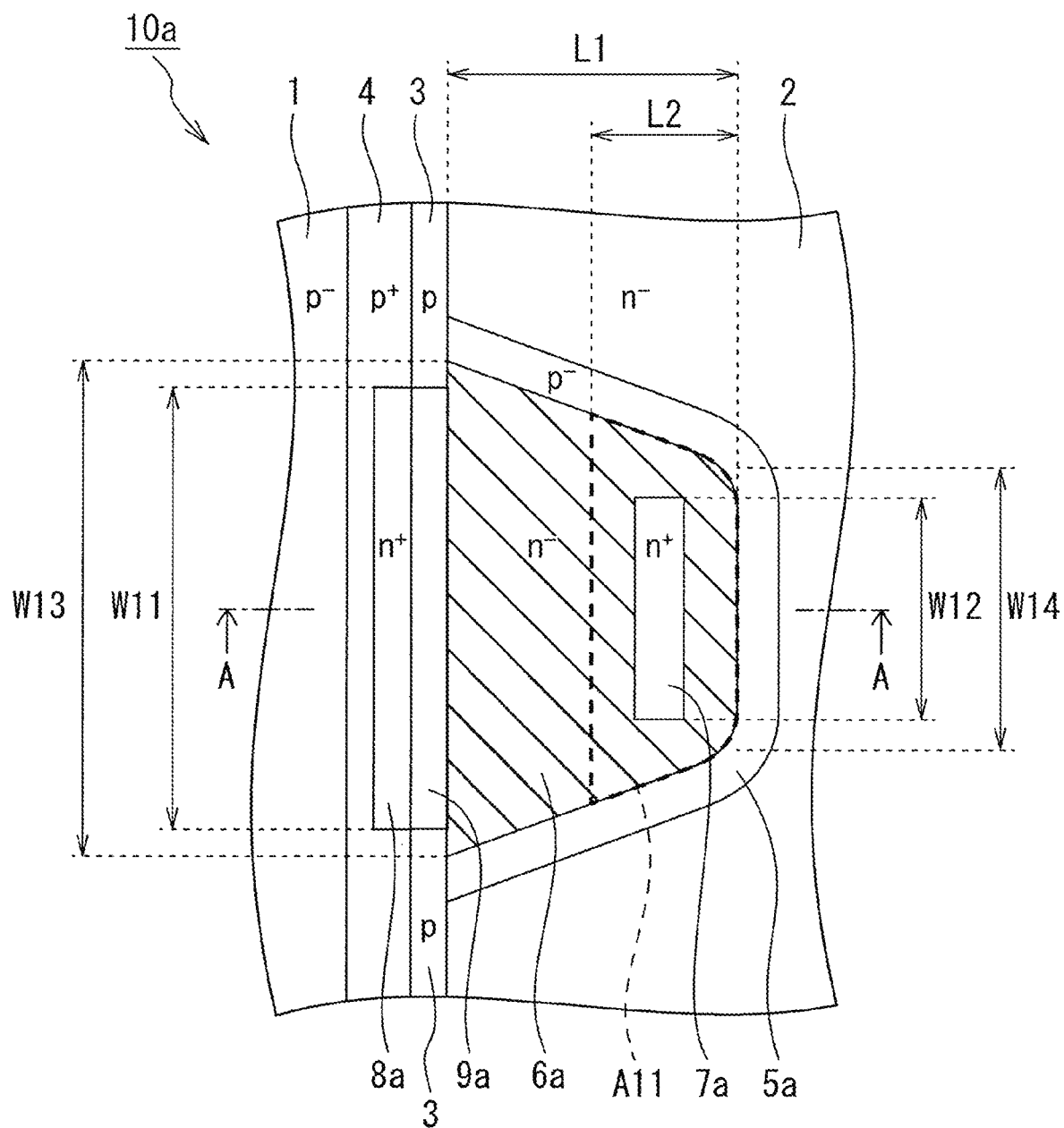
FIG. 3 is an enlarged partial view of a level shifter near the left side of FIG. 2.
Figure 4:
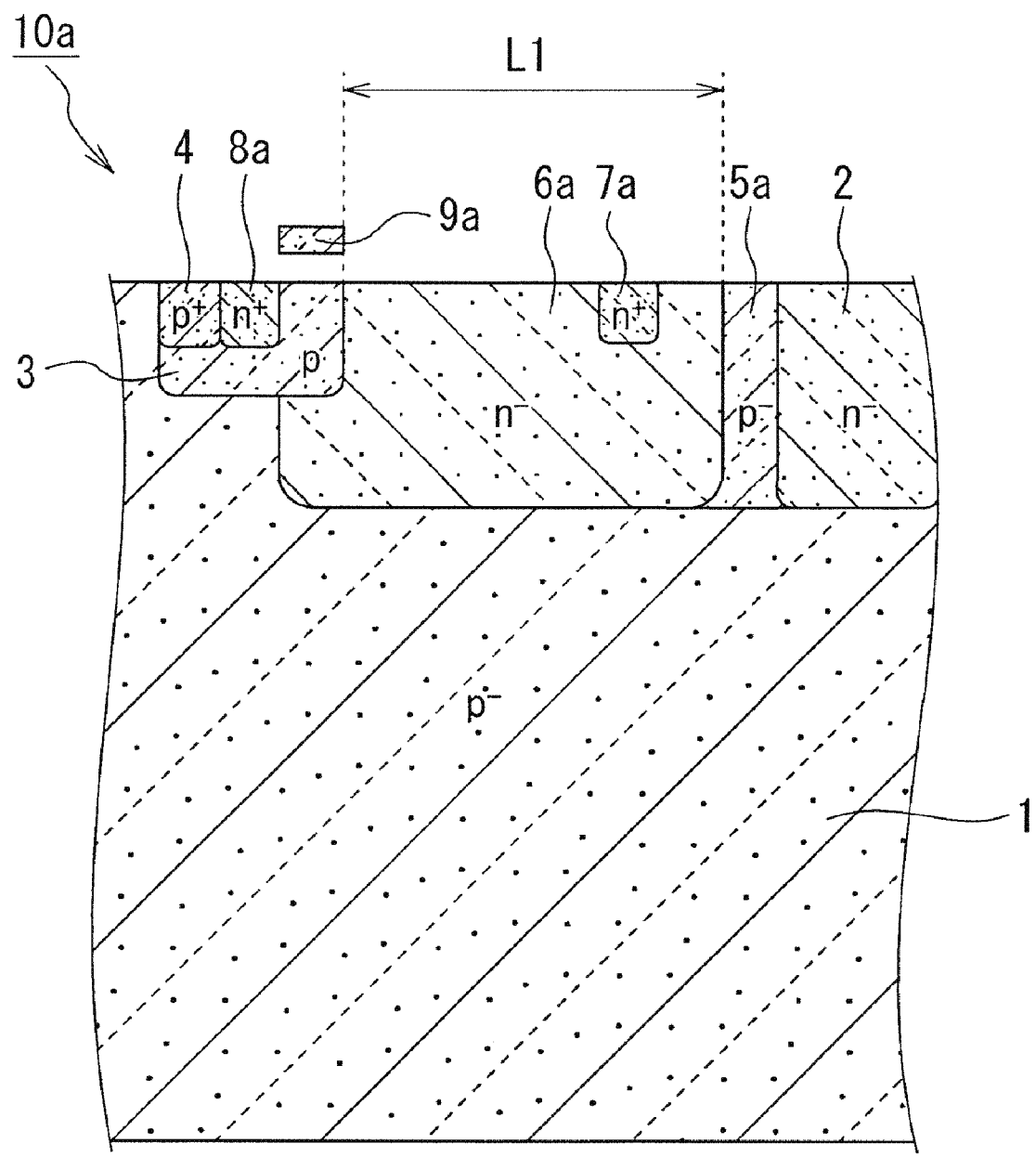
FIG. 4 is a cross-sectional view taken along the A-A direction in FIG. 3.

FIG. 3 illustrates an enlarged view of the planar layout of the first level shifter 10a illustrated near the left side of FIG. 2. Moreover, FIG. 4 illustrates a cross-sectional view taken along the A-A direction in FIG. 3. As illustrated in FIGS. 3 and 4, the first level shifter 10a includes an $n^-$ first drift region 6a formed in an upper portion of the $p^-$ substrate 1 as well as the p-type base region 3 which is selectively formed in an upper portion of the first drift region 6a and has a higher impurity concentration than the substrate 1. The first drift region 6a contacts the $p^-$ first isolation region 5a. In an upper portion of the substrate 1 which is further inwards than the first isolation region 5a, the $n^-$ well region 2 of the high-side circuit region 101 is formed contacting the first isolation region 5a.

The first level shifter 10a further includes an $n^+$ first source region (first main electrode contact region) 8a selectively formed in an upper portion of the base region 3 and an $n^+$ first drain region (second main electrode contact region) 7a selectively formed in an upper portion of the first drift region 6a so as to face the first source region 8a. The impurity concentrations of the first source region 8a and the first drain region 7a are higher than the impurity concentration of the first drift region 6a. The first source region 8a is electrically connected to the ground terminal GND illustrated in FIG. 1 to which the GND voltage is applied. The first drain region 7a is electrically connected via the level shift resistor 68 illustrated in FIG. 1 to the high-side power supply terminal VB to which the VB voltage is applied.

The first level shifter 10a further includes a first gate electrode (control electrode) 9a arranged, with a gate insulating film (not illustrated in the figures) therebeneath, between the first drain region 7a and the first source region 8a. The gate insulating film can be various types of insulating films such as a silicon oxide film ($SiO_2$ film) or a silicon nitride film ($Si_3N_4$ film) other than an $SiO_2$ film, for example, or can be formed as a multilayer insulating film including an $SiO_2$ film and an $Si_3N_4$ film or the like. In a planar pattern, the first gate electrode 9a is arranged, at a position with the first source region 8a and the first drain region 7a on either side, so as to control the voltage of the base region 3. The first gate electrode 9a is made of a polycrystalline silicon film doped with impurities (doped polycrystalline silicon), a metal with a high melting point, a metal silicide with a high melting point, or the like, for example.

As illustrated in FIG. 3, in the semiconductor integrated circuit according to Embodiment 1, the effective channel width W11 of the first level shifter 10a is greater than the width (drain width) W12 of the first drain region 7a. The effective channel width W11 is defined by the width of the portion in which the first gate electrode 9a and the base region 3 overlap, where an inversion channel forms directly beneath the first gate electrode (control electrode) 9a. That is, the effective channel width is defined by a length of the base region 3 that is directly under the control electrode (here, the first gate electrode 9a), as measured along a line perpendicular to a channel current direction. The first drift region 6a has a substantially trapezoidal planar pattern in which the length W13 of the source-side side of the first drift region 6a is greater than the length W14 of the drain-side side of the first drift region 6a. The length W13 of the source-side side of the first drift region 6a should be approximately twice the length W14 of the drain-side side of the first drift region 6a, for example.

In FIG. 3, the planar pattern of the first drift region 6a is schematically illustrated by the diagonal hatching. Moreover, within the p-n junction between the p⁻ substrate 1 and the n⁻ first drift region 6a, a junction region A11 whose parasitic capacitance contributes to the propagation delay time of the first level shifter 10a is illustrated with a dashed line. The junction region A11 is the region near the first drift region 6a which is surrounded by the p⁻ first isolation region 5a. The length L2 of the junction region A11 as defined in a direction orthogonal to the length W13 of the source-side side of the first drift region 6a should be approximately ½ of the length L1 of the drift region 6a as defined in the direction orthogonal to the length W13 of the source-side side of the first drift region 6a, for example.

The second level shifter 10b illustrated near the right side of FIG. 2 has the same configuration as the first level shifter 10a, with a mirror image relationship therebetween. The second level shifter 10b includes an n⁻ second drift region 6b formed in an upper portion of the substrate 1 and the p-type base region 3 which is selectively formed in an upper portion of the second drift region 6b. The second level shifter 10b further includes an n⁺ second source region (first main electrode contact region) 8b selectively formed in an upper portion of the base region 3 and an n⁺ second drain region (second main electrode contact region) 7b selectively formed in an upper portion of the second drift region 6b so as to face the second source region 8b. The second level shifter 10b further includes a second gate electrode (control electrode) 9b arranged, with a gate insulating film (not illustrated in the figures) therebeneath, between the second drain region 7b and the second source region 8b.

In recent years, there has been demand for HVICs to support higher driving frequencies. However, driving at higher frequencies results in an increase in heat generation, and therefore there is demand for reduced current-carrying capability in the first level shifter 10a and the second level shifter 10b (which are the largest source of heat generation in the HVIC). At the same time, reducing the current-carrying capability of the first level shifter 10a and the second level shifter 10b increases the time required for signals to be transmitted (the propagation delay time). This is because the delay time in the first level shifter 10a and the second level shifter 10b is proportional to a parameter C/I, where I is current and C is the parasitic capacitance of the respective p-n junctions between the p⁻ substrate 1 and the n-type first drift region 6a and second drift region 6b.

The amount of heat generated by the HVIC is maximum when the VS voltage is high, and this maximum amount of heat generated is proportional to VS×$I_{sat}$, where $I_{sat}$ is the saturation current of the first level shifter 10a and the second level shifter 10b. Conversely, the propagation delay time of the HVIC is maximum when the VS voltage is low, and this maximum delay time is proportional to $C/I_{on}$, where $I_{on}$ is the ON current of the first level shifter 10a and the second level shifter 10b. In general, methods of reducing the saturation current $I_{sat}$ also result in a reduction in the ON current $I_{on}$, and therefore attempting to reduce heat generation results in an increase in propagation delay time. In other words, there is a trade-off between heat generation and propagation delay time in the first level shifter 10a and the second level shifter 10b.

One characteristic of the first level shifter 10a and the second level shifter 10b is that the ON current $I_{on}$ depends strongly on drift resistance, while the saturation current $I_{sat}$ depends strongly on channel resistance.

The easiest approach to improving the trade-off described above would be to respectively increase the impurity concentrations of the first drift region 6a and the second drift region 6b in order to reduce drift resistance. This would make it possible to increase just the ON current $I_{on}$ without significantly changing the saturation current $I_{sat}$ or the parasitic capacitance C, thereby making it possible to improve the trade-off. However, this approach is equivalent to changing the impurity concentration of the breakdown voltage region and could therefore potentially result in a decrease in breakdown voltage or the like.

Therefore, the semiconductor integrated circuit according to Embodiment 1 focuses on the saturation current $I_{sat}$ and the parameter $C/I_{on}$ to improve the trade-off between heat generation and delay time in the first level shifter 10a and the second level shifter 10b without changing any impurity concentrations.

Comparison Example of Embodiment 1

Figure 5:
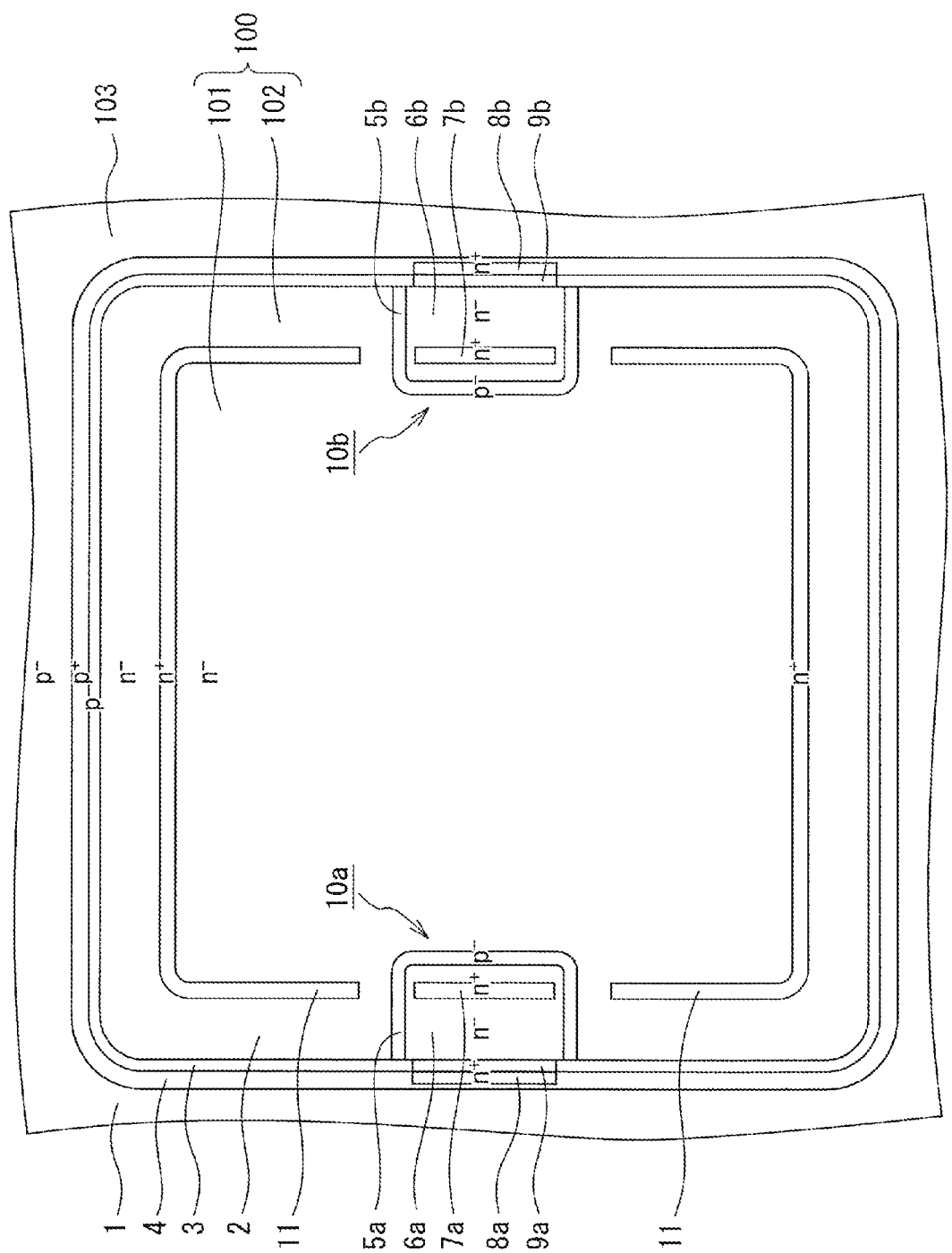
FIG. 5 is a plan view illustrating an example of a semiconductor integrated circuit according to a comparison example of Embodiment 1 of the present invention.
Figure 6:
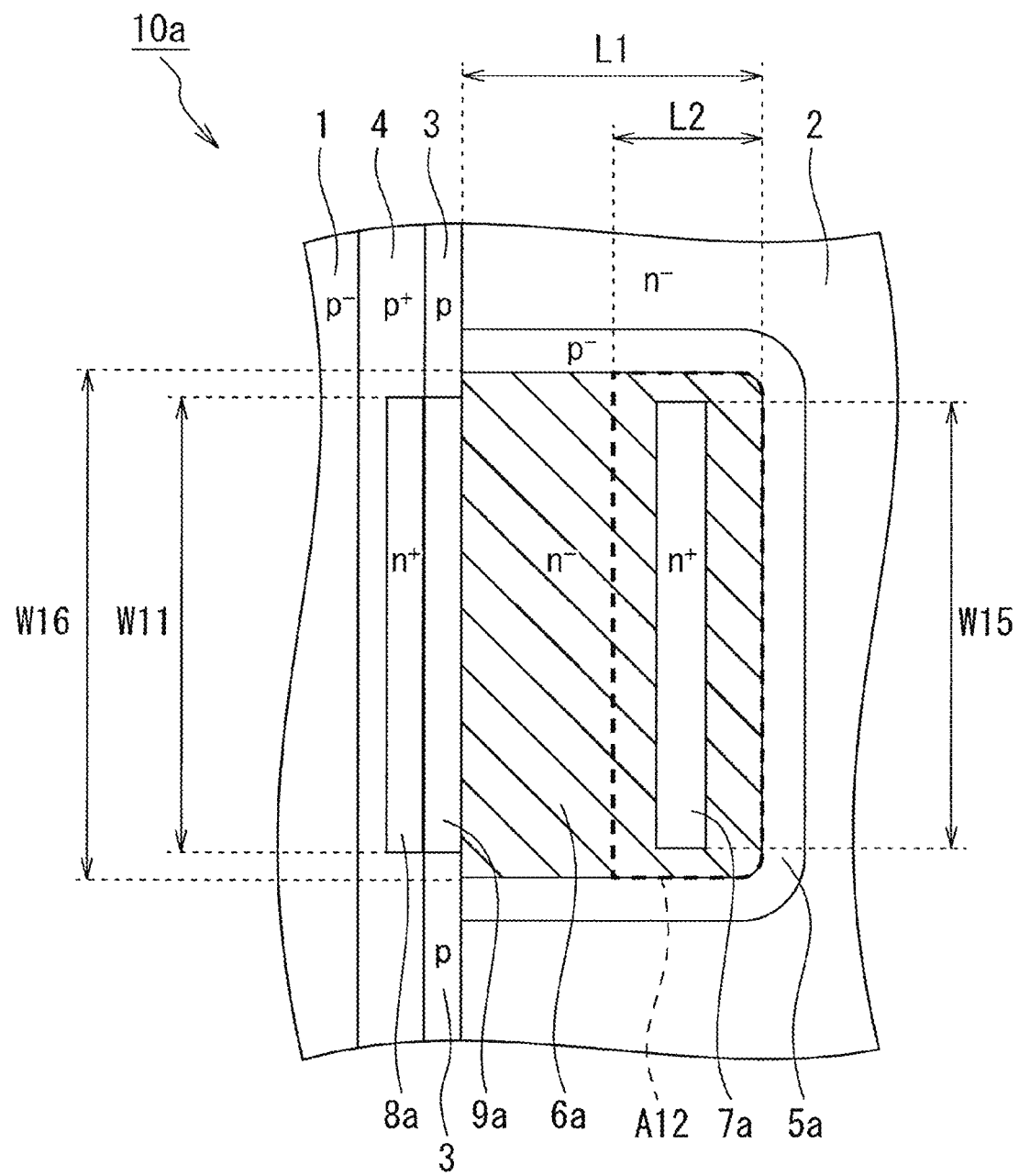
FIG. 6 is an enlarged partial view of a level shifter near the left side of FIG. 5.

Here, a semiconductor integrated circuit according to a comparison example of Embodiment 1 will be described with reference to FIGS. 5 and 6. FIG. 5 illustrates the planar layout of the semiconductor integrated circuit according to the comparison example, and FIG. 6 illustrates an enlarged view of a first level shifter 10a illustrated near the left side of FIG. 5. As illustrated in FIGS. 5 and 6, the semiconductor integrated circuit according to the comparison example is similar to the semiconductor integrated circuit according to Embodiment 1 in that the first level shifter 10a and a second level shifter 10b are formed in a divided SS configuration.

As illustrated in FIG. 6, the semiconductor integrated circuit according to the comparison example is different from the semiconductor integrated circuit according to Embodiment 1 in that the width (drain width) W15 of a first drain region 7a of the first level shifter 10a is longer and in that the drain width W15 is equal to the effective channel width W11. The width W16 of a first drift region 6a is uniform from a first source region 8a side to the first drain region 7a side. In FIG. 6, the planar pattern of the first drift region 6a is illustrated by the diagonal hatching. Moreover, within a p-n junction between a p⁻ substrate 1 and the n-type first drift region 6a, a junction region A12 whose parasitic capacitance contributes to the propagation delay time of the first level shifter 10a is illustrated with a dashed line.

In contrast, as illustrated in FIG. 3, in the divided SS configuration of the semiconductor integrated circuit according to Embodiment 1, the effective channel width W11 of the first level shifter 10a is greater than the drain width W12. The ON current $I_{on}$ is determined by the average width of the first drift region 6a, and therefore because here the average width of the first drift region 6a is less than in the semiconductor integrated circuit according to the comparison example, the ON current $I_{on}$ decreases. Meanwhile, the decrease in the area of the junction region A11 relative to the junction region A12 of the semiconductor integrated circuit according to the comparison example exceeds the decrease in the ON current $I_{on}$. This makes it possible to reduce the parameter $C/I_{on}$, thereby making it possible to reduce the propagation delay time.

Assume that the first drift region 6a of the semiconductor integrated circuit according to Embodiment 1 as illustrated in FIG. 3 has a trapezoidal planar shape, and assume that the first drift region 6a of the semiconductor integrated circuit according to the comparison example as illustrated in FIG. 5 has a rectangular planar shape, for example. If it is further assumed that the length W14 of the drain-side side of the first drift region 6a of the semiconductor integrated circuit according to Embodiment 1 is half the length W13 of the source-side side and that the respective lengths L2 of the junction region A11 of the semiconductor integrated circuit according to Embodiment 1 and the junction region A12 of the semiconductor integrated circuit according to the comparison example are half the length L1 of the first drift region 6a, then in the semiconductor integrated circuit according to Embodiment 1, the average width of the first drift region 6a is decreased by approximately 25% and the junction region A11 is decreased by approximately 37.5% relative to in the semiconductor integrated circuit according to the comparison example.

Moreover, because the channel structure of the semiconductor integrated circuit according to Embodiment 1 is the same as in the semiconductor integrated circuit according to the comparison example, the saturation current $I_{sat}$ is substantially unchanged, which makes it possible to constrain the amount of heat generated. The second level shifter 10b also has the same configuration as the level shifter 10a and therefore exhibits the same advantageous effects as described above for the first level shifter 10a. As a result, the trade-off between heat generation and propagation delay time in the first level shifter 10a and the second level shifter 10b can be improved.

Working Examples of Embodiment 1

Working Examples A and B of the semiconductor integrated circuit according to Embodiment 1 were manufactured. The effective channel widths of Working Examples A and B were both set to be 192.1 μm, and all other parameters of Working Examples A and B including the effective channel width but excluding the drain width were set to be the same. The drain width of Working Example A was set to be 138.7 μm, and the drain width of Working Example B was set to be 69.3 μm (approximately half of the drain width of Working Example A). The results of measuring the ON current $I_{on}$, saturation current $I_{sat}$, and propagation delay time of Working Examples A and B are shown in Table 1.

TABLE 1

| | Drain Width | Effective Channel Width | $I_{on}$ | $I_{sat}$ | Propagation Delay Time |
|---|---|---|---|---|---|
| Working Example A | 138.7 μm | 192.1 μm | 1.64 mA | 3.26 mA | 39.6 ns |
| Working Example B | 69.3 μm | 192.1 μm | 1.39 mA | 3.27 mA | 39.2 ns |

As shown in Table 1, in Working Example B (which had the relatively smaller drain width), although the ON current $I_{on}$ decreased, the propagation delay time was less than in Working Example A (which had the relatively greater drain width). Moreover, in Working Example B the saturation current $I_{sat}$ was substantially unchanged relative to in Working Example A.

Modification Example of Embodiment 1

Figure 7:
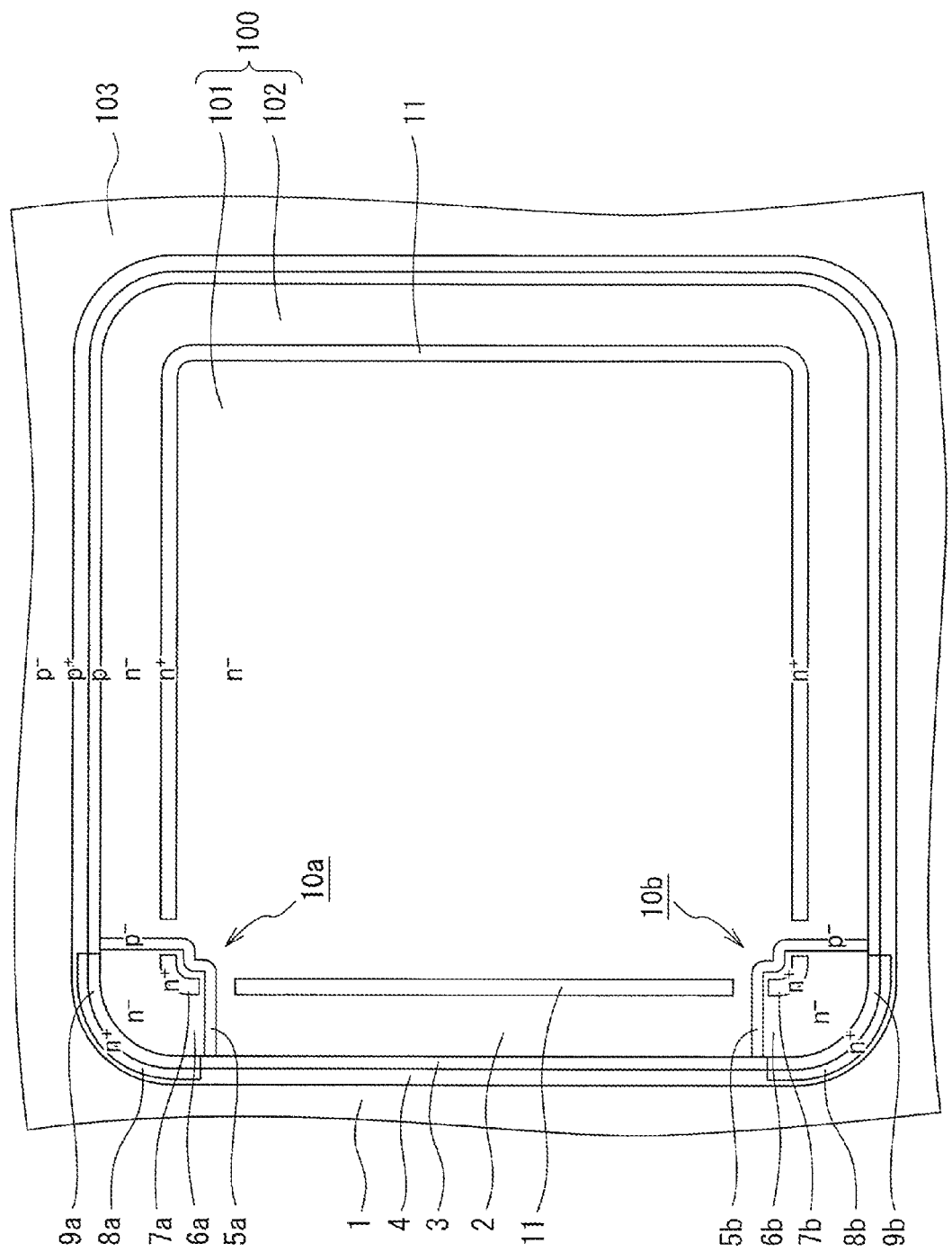
FIG. 7 is a plan view illustrating an example of a semiconductor integrated circuit according to a modification example of Embodiment 1 of the present invention.

As illustrated in FIG. 7, in a semiconductor integrated circuit according to a modification example of Embodiment 1, the arrangement positions of a first level shifter 10a and a second level shifter 10b in a divided SS configuration are different from in the semiconductor integrated circuit according to Embodiment 1 as illustrated in FIG. 2. As illustrated in FIG. 7, the first level shifter 10a is formed in the upper left corner of a high-side circuit portion 100. The second level shifter 10b is formed in the lower left corner of the high-side circuit portion 100. Thus, they are positioned at line-symmetric positions relative to the center vertical line and facing each other.

Figure 8:
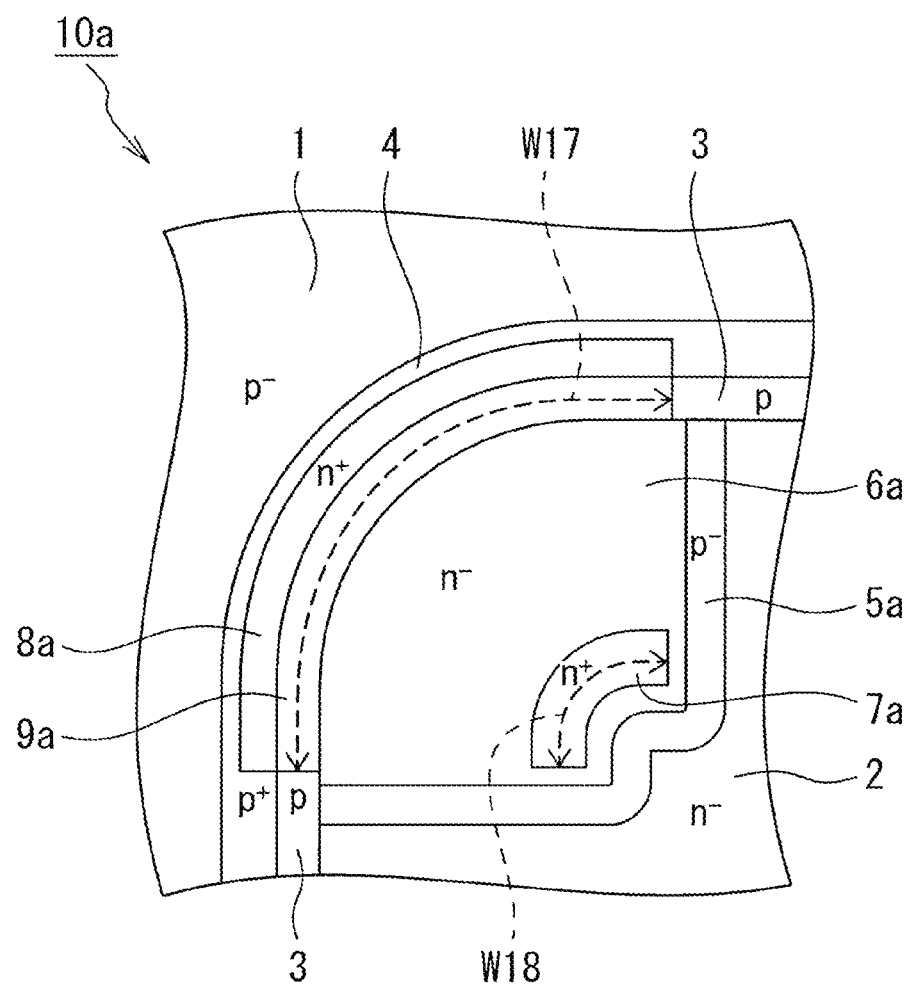
FIG. 8 is an enlarged partial view of a level shifter near the upper left side of FIG. 7.

FIG. 8 illustrates an enlarged view of the first level shifter 10a illustrated near the upper left of FIG. 7. The first level shifter 10a includes an n⁻ first drift region 6a formed in an upper portion of a p⁻ substrate 1 as well as a p-type base region 3 which is selectively formed in an upper portion of the first drift region 6a. The base region 3 is formed in an arc-shaped planar pattern so as to have curvature.

The first level shifter 10a further includes an n⁺ first source region (first main electrode contact region) 8a selectively formed in an upper portion of the base region 3 and an n⁺ first drain region (second main electrode contact region) 7a selectively formed in an upper portion of the first drift region 6a so as to face the first source region 8a. The first source region 8a and the first drain region 7a are formed in arc-shaped planar patterns so as to have curvature. The first source region 8a is positioned as a planar pattern on the outer peripheral side of the arc forming the curvature of the first drain region 7a.

The first level shifter 10a further includes a first gate electrode (control electrode) 9a arranged, with a gate insulating film (not illustrated in the figures) therebeneath, between the first drain region 7a and the first source region 8a. The first gate electrode 9a is formed in an arc-shaped planar pattern so as to have curvature. Here, the effective channel width W17 of the first level shifter 10a is greater than the width (drain width) W18 of the first drain region 7a. The effective channel width W17 is defined by the length of the arc forming the curvature of the portion in which the first gate electrode 9a and the base region 3 overlap, where an inversion channel forms directly beneath the first gate electrode (control electrode) 9a. The drain width W18 is defined by the length of the arc forming the curvature of the first drain region 7a. In other words, the effective channel width W17 and the drain width W18 are measured along the arcs forming the curvature of the first gate electrode 9a and the first drain region 7a.

The second level shifter 10b illustrated near the lower left of FIG. 7 has the same configuration as the first level shifter 10a, with a mirror image relationship therebetween. The second level shifter 10b includes an n⁻ second drift region 6b formed in an upper portion of the substrate 1 and a p-type base region 3 which is selectively formed in an upper portion of the second drift region 6b. The second level shifter 10b further includes an n⁺ second source region (first main electrode contact region) 8b selectively formed in an upper portion of the base region 3 and an n⁺ second drain region (second main electrode contact region) 7b selectively formed in an upper portion of the second drift region 6b so as to face the second source region 8b. The second level shifter 10b further includes a second gate electrode (control electrode) 9b arranged, with a gate insulating film (not illustrated in the figures) therebeneath, between the second drain region 7b and the second source region 8b. The rest of the configuration of the semiconductor integrated circuit according to the modification example of Embodiment 1 is the same as the rest of the configuration of the semiconductor integrated circuit according to Embodiment 1 and therefore will not be described again.

Similar to the semiconductor integrated circuit according to Embodiment 1, the semiconductor integrated circuit according to the modification example of Embodiment 1 makes it possible to improve the trade-off between heat generation and propagation delay time in the first level shifter 10a and the second level shifter 10b. Moreover, forming the first level shifter 10a and the second level shifter 10b at corners of the high-side circuit portion 100 makes the current distribution uniform and makes it possible to prevent damage resulting from current concentration. Furthermore, forming the first level shifter 10a and the second level shifter 10b at two neighboring upper/lower/left/right corners among the four corners formed by the HVJT structure 102 makes it possible to compensate for variations in masks. In addition, the first level shifter 10a and the second level shifter 10b may be formed at two corners that are opposite one another among the four corners formed by the HVJT structure 102.

Figure 9:
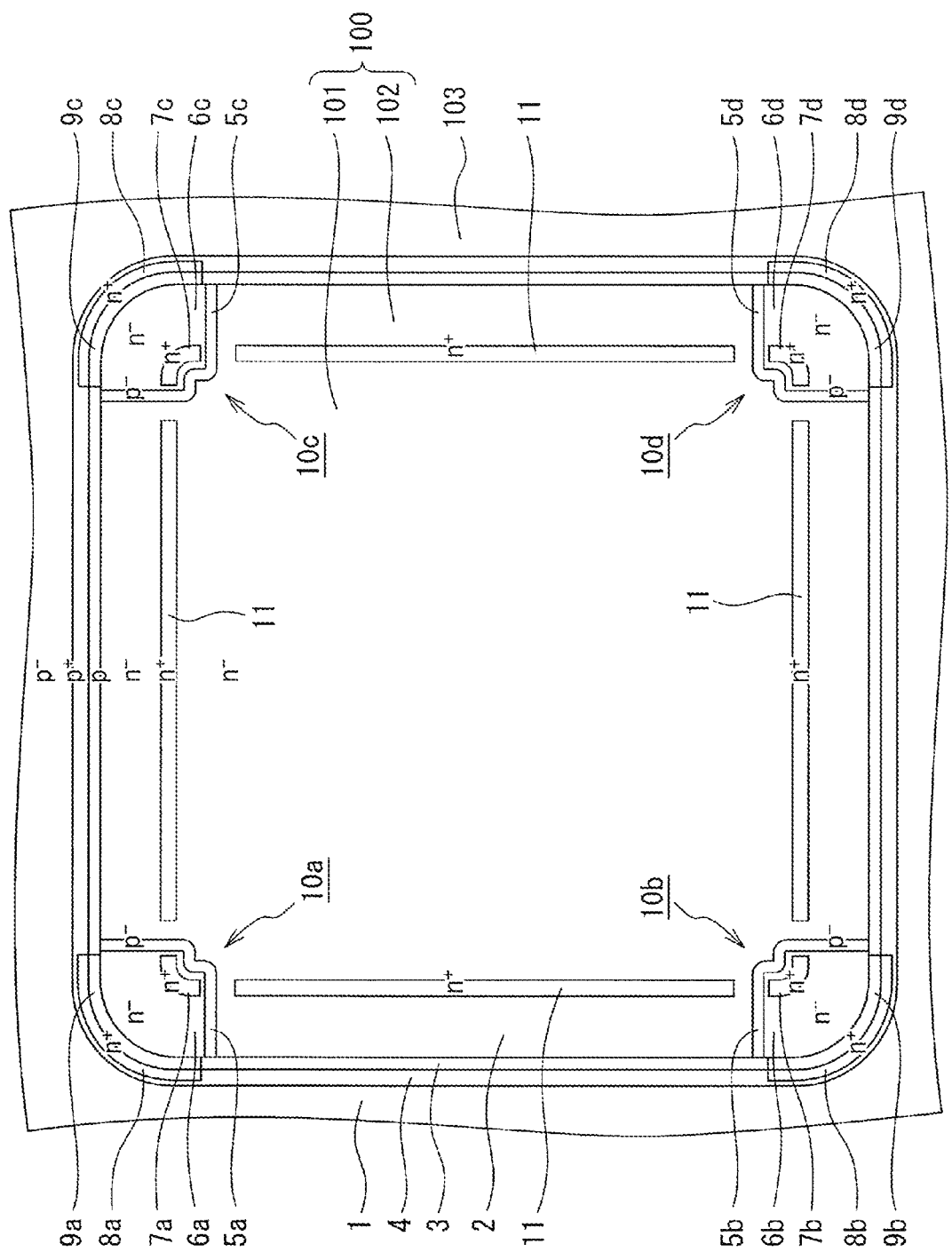
FIG. 9 is a plan view illustrating another example of a semiconductor integrated circuit according to a modification example of Embodiment 1 of the present invention.

Moreover, as illustrated in FIG. 9, in a divided SS configuration a first level shifter 10a, a second level shifter 10b, a third level shifter 10c, and a fourth level shifter 10d (four level shifters) may respectively be formed at the four corners formed by the HVJT structure 102. The third level shifter 10c illustrated near the upper right of FIG. 9 has the same configuration as the first level shifter 10a, with left-right symmetry therebetween. The third level shifter 10c includes an n-type third drift region 6c formed in an upper portion of the substrate 1 and a p-type base region 3 which is selectively formed in an upper portion of the third drift region 6c. The third level shifter 10c further includes an n⁺ third source region (first main electrode contact region) 8c selectively formed in an upper portion of the base region 3 and an n⁺ third drain region (second main electrode contact region) 7c selectively formed in an upper portion of the second drift region 6c so as to face the third source region 8c. The third level shifter 10c further includes a third gate electrode (control electrode) 9c arranged, with a gate insulating film (not illustrated in the figure) therebeneath, between the third drain region 7c and the third source region 8c.

The fourth level shifter 10d illustrated near the lower right of FIG. 9 has the same configuration as the second level shifter 10b, with left-right symmetry therebetween. The fourth level shifter 10d includes an n⁻ fourth drift region 6d formed in an upper portion of the substrate 1 and a p-type base region 3 which is selectively formed in an upper portion of the fourth drift region 6d. The fourth level shifter 10d further includes an n⁺ fourth source region (first main electrode contact region) 8d selectively formed in an upper portion of the base region 3 and an n⁺ fourth drain region (second main electrode contact region) 7d selectively formed in an upper portion of the fourth drift region 6d so as to face the fourth source region 8d. The fourth level shifter 10d further includes a fourth gate electrode (control electrode) 9d arranged, with a gate insulating film (not illustrated in the figure) therebeneath, between the fourth drain region 7d and the fourth source region 8d.

Embodiment 2

Figure 10:
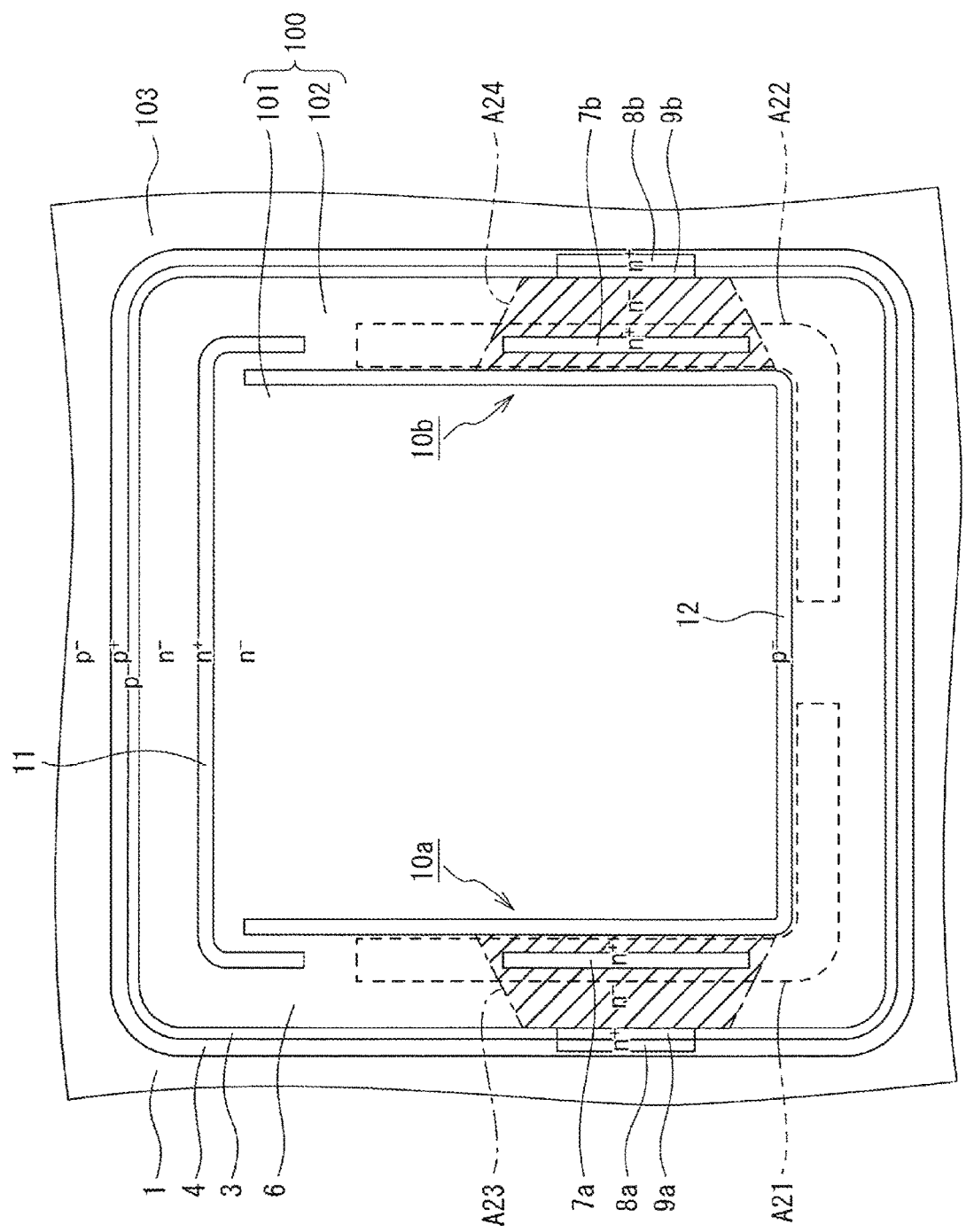
FIG. 10 is a plan view illustrating an example of a semiconductor integrated circuit according to Embodiment 2 of the present invention.

An equivalent circuit of a semiconductor integrated circuit according to Embodiment 2 of the present invention is the same as the equivalent circuit of the semiconductor integrated circuit according to Embodiment 1 as illustrated in FIG. 1. As illustrated in FIG. 10, a high-side circuit portion 100 of the semiconductor integrated circuit according to Embodiment 2 includes a high-side circuit region 101 and an HVJT structure 102 arranged in an area surrounding the high-side circuit region 101. A first level shifter 10a and a second level shifter 10b are formed in portions of the HVJT structure 102. The semiconductor integrated circuit according to Embodiment 2 is different from the semiconductor integrated circuit according to Embodiment 1 (which has a divided SS configuration) in that the first level shifter 10a and the second level shifter 10b are formed in a non-divided SS configuration in which the high-side circuit region 101 is surrounded by a p⁻ isolation region 12.

In other words, an n⁺ contact region 11 is formed in a downward-facing U-shape in a portion of the area surrounding the high-side circuit region 101. In another portion of the area surrounding the high-side circuit region 101, the p⁻ isolation region 12 is formed in an upward-facing U-shape facing the contact region 11. The upper ends of the isolation region 12 are contained within the contact region 11. In other words, the width of the opening of the U-shape of the isolation region 12 is narrower than the width of the opening of the U-shape of the contact region 11. The first level shifter 10a and the second level shifter 10b are electrically isolated from the high-side circuit region 101 by the p⁻ isolation region 12. An n⁻ well region 6 is formed in a ring shape around the outer periphery of the p⁻ isolation region 12.

Figure 11:
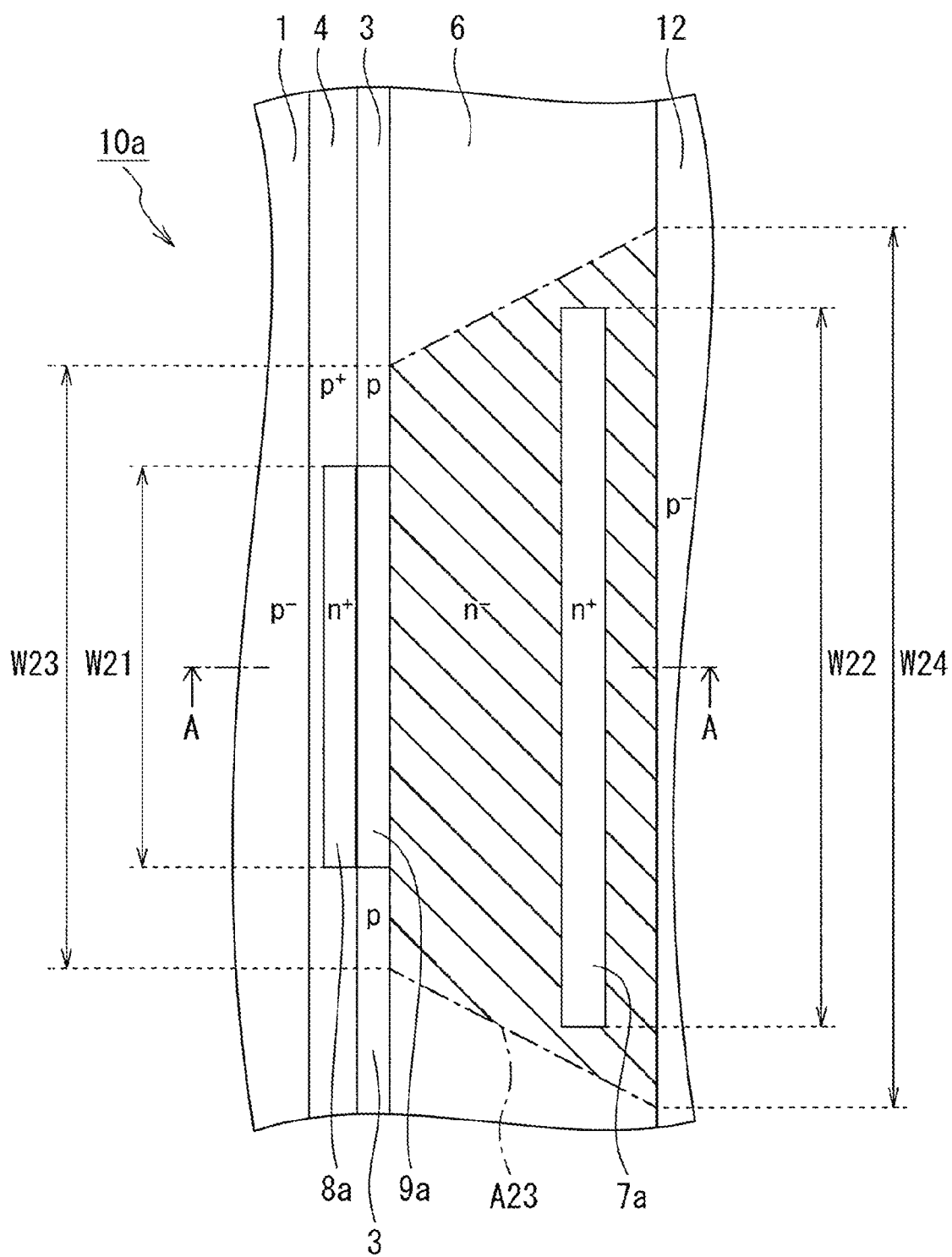
FIG. 11 is an enlarged partial view of a level shifter near the left side of FIG. 10.
Figure 12:
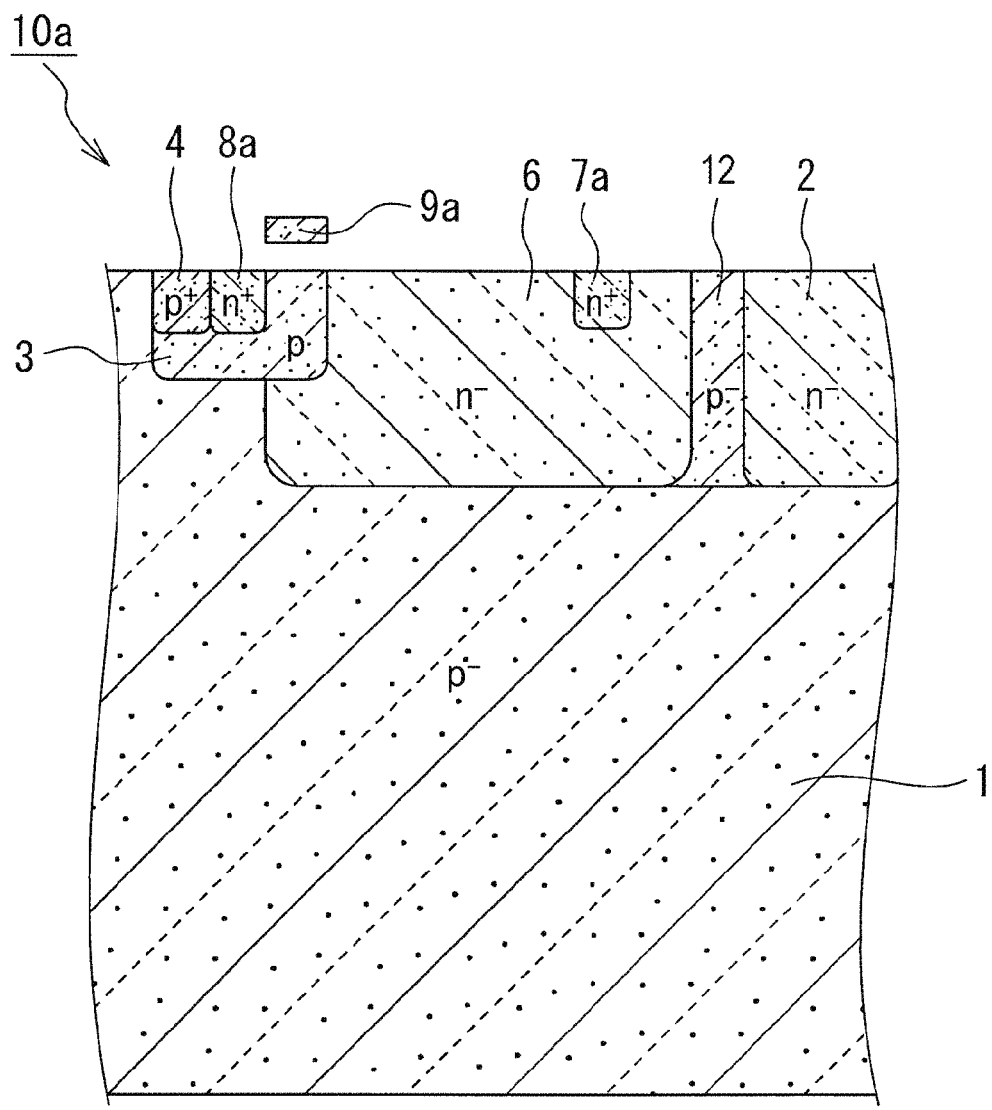
FIG. 12 is a cross-sectional view taken along the A-A direction in FIG. 11.

FIG. 11 illustrates an enlarged view of the planar layout of the first level shifter 10a illustrated near the left side of FIG. 10. Moreover, FIG. 12 illustrates a cross-sectional view taken along the A-A direction in FIG. 11. As illustrated in FIGS. 11 and 12, the first level shifter 10a is formed in an upper portion of a p⁻ substrate 1. The first level shifter 10a includes a first drift region constituted by a portion of the n⁻ well region 6 formed in an upper portion of the substrate 1 as well as a p-type base region 3 which is selectively formed in an upper portion of the first drift region 6.

The first level shifter 10a further includes an n⁺ first source region (first main electrode contact region) 8a selectively formed in an upper portion of the base region 3 and an n⁺ first drain region (second main electrode contact region) 7a selectively formed in an upper portion of the first drift region 6 so as to face the first source region 8a. The impurity concentrations of the first source region 8a and the first drain region 7a are higher than the impurity concentration of the first drift region 6. The first level shifter 10*a* further includes a first gate electrode (control electrode) 9*a* arranged, with a gate insulating film (not illustrated in the figures) therebeneath, between the first drain region 7*a* and the first source region 8*a*.

As illustrated in FIG. 11, in the semiconductor integrated circuit according to Embodiment 2, the effective channel width W21 of the first level shifter 10*a* is less than the width (drain width) W22 of the first drain region 7*a* as measured along the same direction as the effective channel width W21. The effective channel width W21 is defined by the width, in a planar pattern, of the base region 3 in a portion in which the first gate electrode 9*a* and the base region 3 overlap, where an inversion channel forms directly beneath the first gate electrode 9*a*. The length W23 of the first source region 8*a*-side side of the first drift region 6 is less than the length W24 of the first drain region 7*a*-side side of the first drift region 6, thereby forming a trapezoidal planar pattern. In FIGS. 10 and 11, a region A23 which functions as the first drift region 6 through which the current of the first level shifter 10*a* flows is schematically illustrated by diagonal hatching.

The second level shifter 10*b* illustrated near the right side of FIG. 10 has the same configuration as the first level shifter 10*a*, with left-right symmetry therebetween. The second level shifter 10*b* includes a second drift region constituted by a portion of the n⁻ well region 6 formed in an upper portion of the substrate 1 as well as a p-type base region 3 which is selectively formed in an upper portion of the second drift region 6. The second level shifter 10*b* further includes an n⁺ second source region 8*b* (first main electrode contact region) selectively formed in an upper portion of the base region 3 and an n⁺ second drain region 7*b* (second main electrode contact region) selectively formed in an upper portion of the second drift region 6 so as to face the second source region 8*b*. The second level shifter 10*b* further includes a second gate electrode (control electrode) 9*b* arranged, with a gate insulating film (not illustrated in the figures) therebeneath, between the second drain region 7*b* and the second source region 8*b*. In FIG. 10, a region A24 which functions as the second drift region 6 through which the current of the second level shifter 10*b* flows is schematically illustrated by diagonal hatching.

Moreover, in FIG. 10, within the p-n junction between the p⁻ substrate 1 and the n⁻ first drift region 6 of the first level shifter 10*a*, a junction region A21 whose parasitic capacitance C contributes to the propagation delay time of the first level shifter 10*a* is illustrated with a dashed line. Similarly, within the p-n junction between the p substrate 1 and the n⁻ second drift region 6 of the second level shifter 10*b*, a junction region A22 whose parasitic capacitance C contributes to the propagation delay time of the second level shifter 10*b* is also illustrated with a dashed line. The junction regions A21 and A22 are regions that take substantially the same voltage as the drain voltage and are regions in which the voltage fluctuates significantly. The junction regions A21 and A22 respectively extend along the p⁻ isolation region 12 so as to respectively contain areas near the first drain region 7*a* and the second drain region 7*b*.

Comparison Example of Embodiment 2

Figure 13:
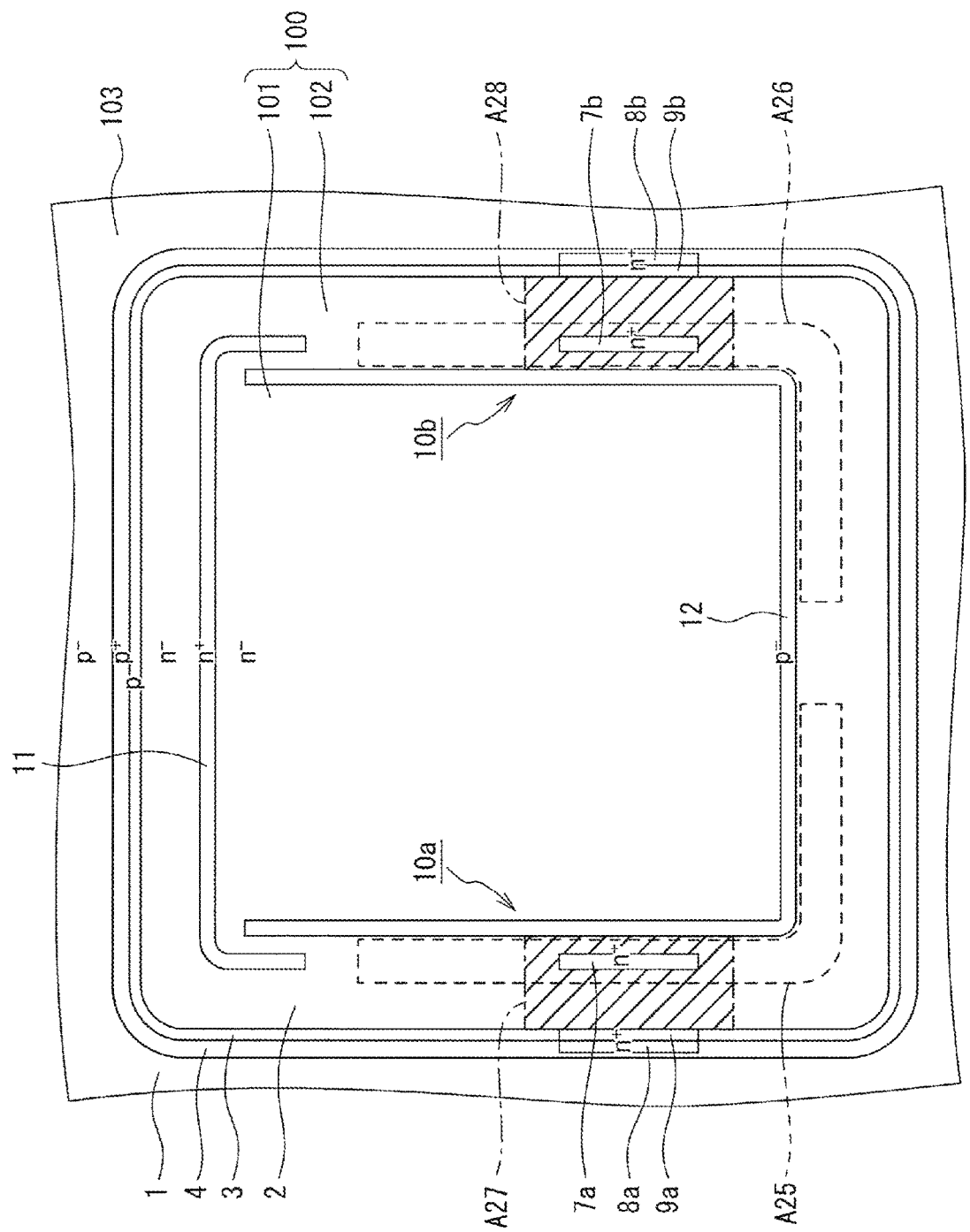
FIG. 13 is a plan view illustrating an example of a semiconductor integrated circuit according to a comparison example of Embodiment 2 of the present invention.
Figure 14:
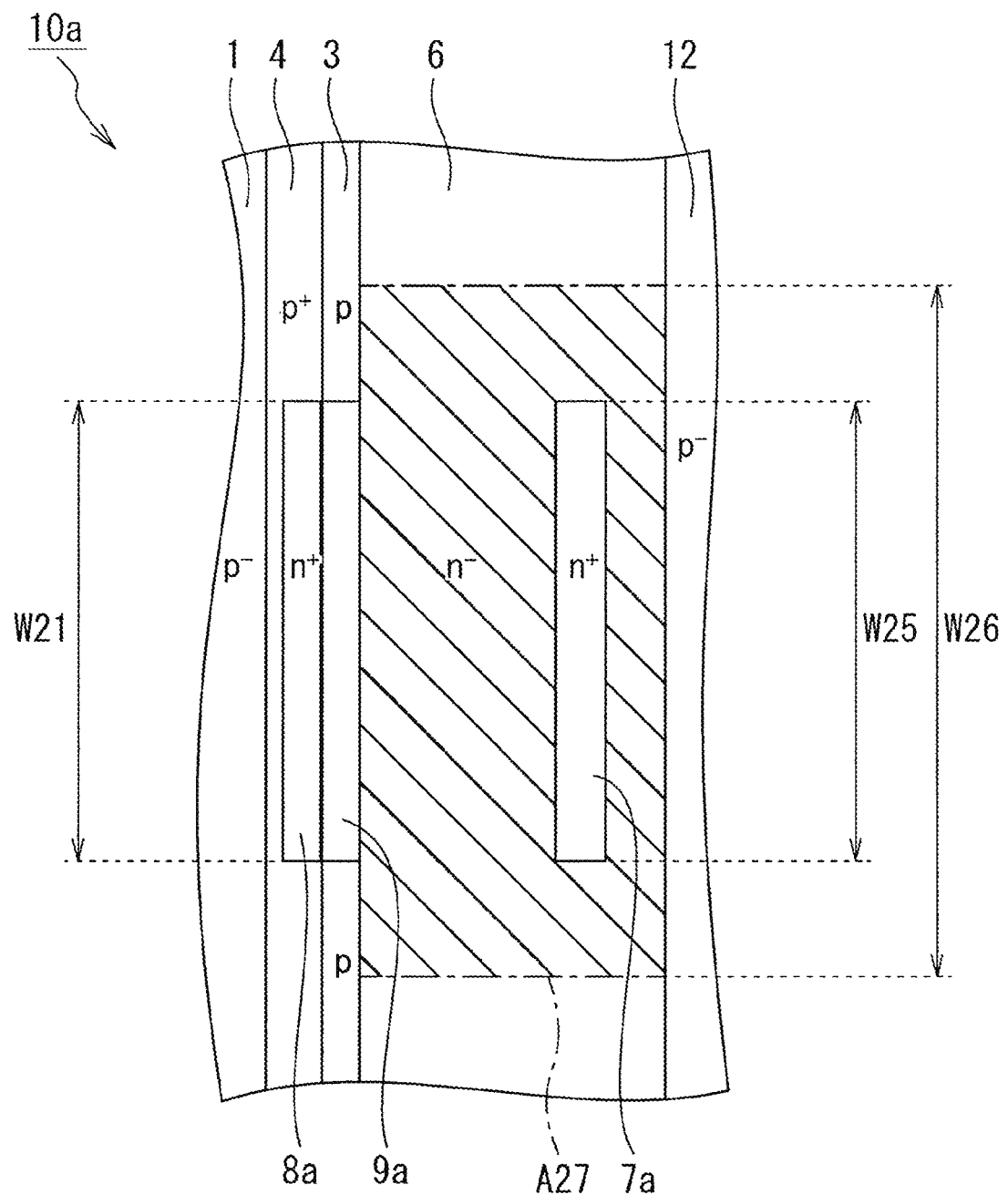
FIG. 14 is an enlarged partial view of a level shifter near the left side of FIG. 13.

Here, a semiconductor integrated circuit according to a comparison example of Embodiment 2 will be described with reference to FIGS. 13 and 14. FIG. 13 illustrates the planar layout of the semiconductor integrated circuit according to the comparison example, and FIG. 14 illustrates an enlarged view of a first level shifter 10*a* illustrated near the left side of FIG. 13. As illustrated in FIGS. 13 and 14, the semiconductor integrated circuit according to the comparison example is similar to the semiconductor integrated circuit according to Embodiment 2 in that the first level shifter 10*a* and a second level shifter 10*b* are formed in a non-divided SS configuration.

However, as illustrated in FIG. 14, the semiconductor integrated circuit according to the comparison example is different from the semiconductor integrated circuit according to Embodiment 2 in that the width (drain width) W25 of a first drain region 7*a* of the first level shifter 10*a* is shorter and in that the drain width W25 is equal to the effective channel width W21. The width W26 of a first drift region 6 of the first level shifter 10*a* is uniform from a first source region 8*a* side to the first drain region 7*a* side. In FIGS. 13 and 14, a region A27 which functions as the first drift region 6 through which the current of the first level shifter 10*a* flows is schematically illustrated by diagonal hatching.

The second level shifter 10*b* illustrated in FIG. 13 has the same configuration as the first level shifter 10*a*. In FIG. 13, a region A28 which functions as a second drift region 6 through which the current of the second level shifter 10*b* flows is schematically illustrated by diagonal hatching. Moreover, in FIG. 13, within the p-n junction between a p⁻ substrate 1 and the n⁻ first drift region 6, a junction region A25 whose parasitic capacitance C contributes to the propagation delay time of the first level shifter 10*a* is illustrated with a dashed line. Similarly, within the p-n junction between the p⁻ substrate 1 and the n⁻ second drift region 6, a junction region A26 whose parasitic capacitance C contributes to the propagation delay time of the second level shifter 10*b* is also illustrated with a dashed line.

In contrast, as illustrated in FIG. 11, in the non-divided SS configuration of the semiconductor integrated circuit according to Embodiment 2, the drain width W22 of the first level shifter 10*a* is greater than the effective channel width W21. The ON current $I_{on}$ of the first level shifter 10*a* is determined by the average width of the drift region 6, and therefore because here the average width of the drift region 6 is greater than in the semiconductor integrated circuit according to the comparison example, the ON current $I_{on}$ of the first level shifter 10*a* can be increased. Meanwhile, in a non-divided SS configuration, the junction region A21 whose parasitic capacitance C contributes to the propagation delay time of the first level shifter 10*a* has a large area extending along the p⁻ isolation region 12 and is therefore substantially unchanged in comparison to the junction region A25 of the semiconductor integrated circuit according to the comparison example. This makes it possible to reduce the parameter $C/I_{on}$, thereby making it possible to reduce the propagation delay time.

Moreover, the channel structure of the semiconductor integrated circuit according to Embodiment 2 is the same as in the semiconductor integrated circuit according to the comparison example, and the saturation current $I_{sat}$ is substantially unchanged, which makes it possible to constrain heat generation. Moreover, the second level shifter 10*b* also has the same configuration as the level shifter 10*a* and therefore exhibits the same advantageous effects as described above for the first level shifter 10*a*. As a result, in this non-divided SS configuration, the trade-off between heat generation and propagation delay time in the first level shifter 10*a* and the second level shifter 10*b* can be improved.

Working Examples of Embodiment 2

Comparison Example A and Working Example C of the semiconductor integrated circuit according to Embodiment 2 were manufactured. The effective channel widths of Comparison Example A and Working Example C were both set to be 192.1 μm, and all other parameters of Comparison Example A and Working Example C including the effective channel width but excluding the drain width were set to be the same. In Comparison Example A the drain width was set to be 138.7 μm (less than the effective channel width), and in Working Example C the drain width was set to be 234.7 μm (greater than the effective channel width). The results of measuring the ON current $I_{on}$, saturation current $I_{sat}$, and propagation delay time of Comparison Example A and Working Example C are shown in Table 2.

TABLE 2

| | Drain Width | Effective Channel Width | $I_{on}$ | $I_{sat}$ | Propagation Delay Time |
|---|---|---|---|---|---|
| Comparison Example A | 138.7 μm | 192.1 μm | 1.78 mA | 3.28 mA | 47.1 ns |
| Working Example C | 234.7 μm | 192.1 μm | 1.90 mA | 3.29 mA | 46.7 ns |

As shown in Table 2, in Working Example C the ON current $I_{on}$ increased and the propagation delay time decreased relative to in Comparison Example A. Moreover, in Working Example C the saturation current $I_{sat}$ was substantially unchanged relative to in Comparison Example A.

Modification Example of Embodiment 2

Figure 15:
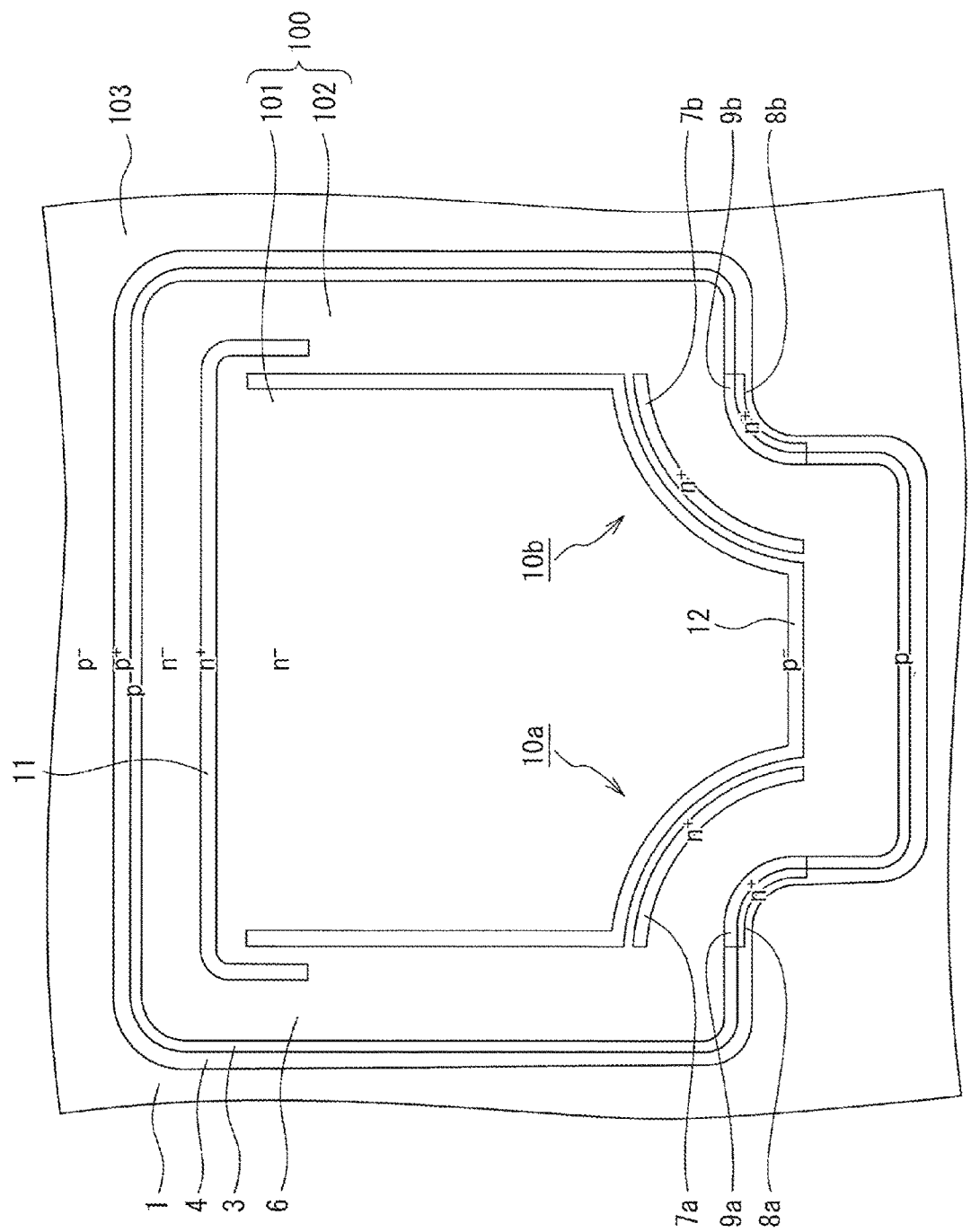
FIG. 15 is a plan view illustrating an example of a semiconductor integrated circuit according to a modification example of Embodiment 2 of the present invention.

As illustrated in FIG. 15, in a semiconductor integrated circuit according to a modification example of Embodiment 2, the arrangement positions of a first level shifter 10a and a second level shifter 10b in a non-divided SS configuration are different from in the semiconductor integrated circuit according to Embodiment 2 as illustrated in FIG. 10. As illustrated in FIG. 15, the first level shifter 10a is formed in a lower left corner formed by an HVJT structure 102 of a high-side circuit portion 100. The second level shifter 10b is formed in a lower right corner formed by the HVJT structure 102 of the high-side circuit portion 100.

Figure 16:
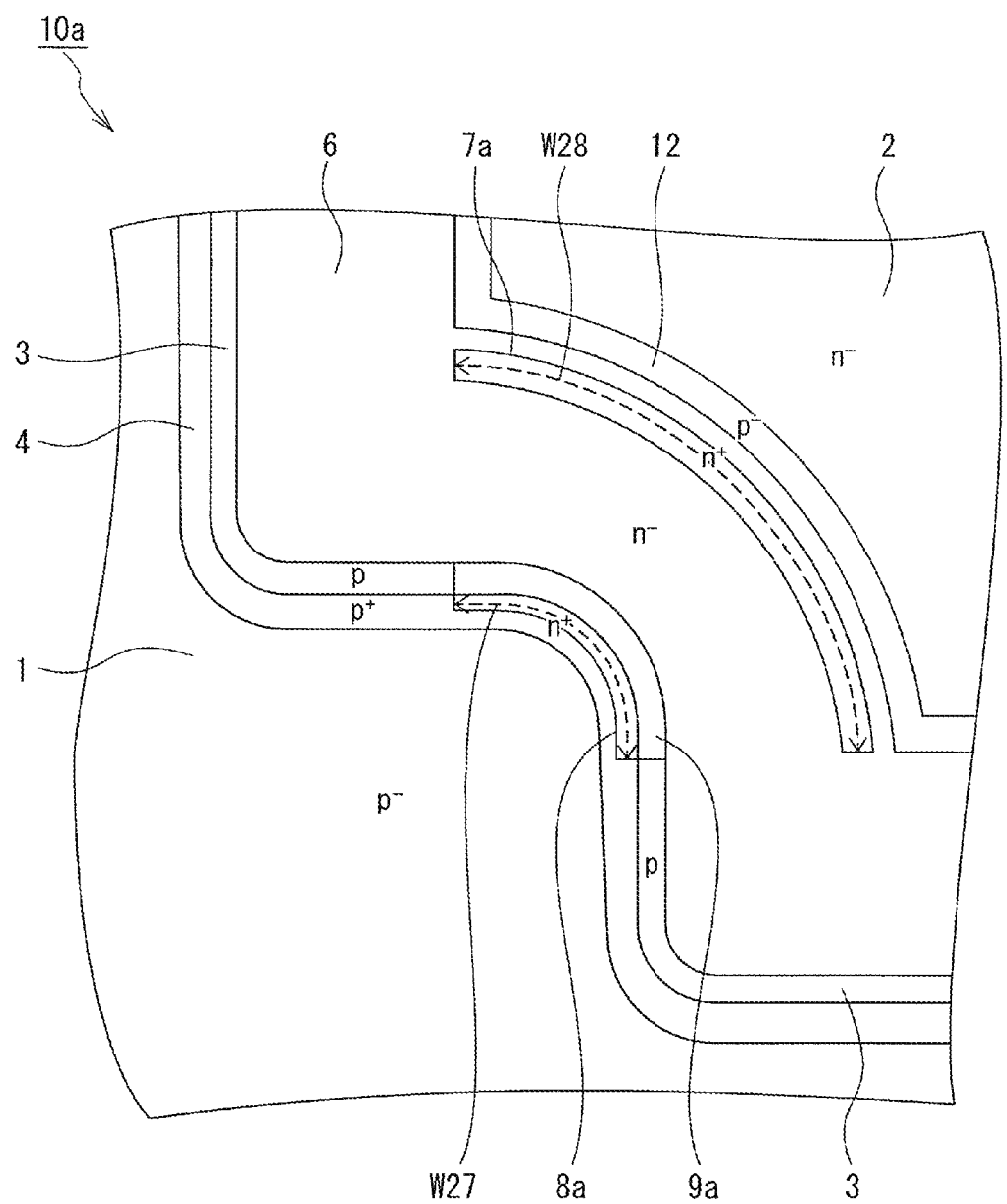
FIG. 16 is an enlarged partial view of a level shifter near the lower left side of FIG. 15.

FIG. 16 illustrates an enlarged view of the first level shifter 10a illustrated near the lower left of FIG. 15. The first level shifter 10a includes an n-type first drift region 6 formed in an upper portion of a substrate 1 as well as a p-type base region 3 which is selectively formed in an upper portion of the first drift region 6. The base region 3 is formed in an arc-shaped planar pattern so as to have curvature.

The first level shifter 10a further includes an n+ first source region (first main electrode contact region) 8a selectively formed in an upper portion of the base region 3 and an n+ first drain region (second main electrode contact region) 7a selectively formed in an upper portion of the first drift region 6 so as to face the first source region 8a. The first source region 8a and the first drain region 7a are formed in arc-shaped planar patterns so as to have curvature. The first drain region 7a is positioned as a planar pattern on the outer peripheral side of the arc forming the curvature of the first source region 8a.

The first level shifter 10a further includes a first gate electrode (control electrode) 9a arranged, with a gate insulating film (not illustrated in the figures) therebeneath, between the first drain region 7a and the first source region 8a. The first gate electrode 9a is formed in an arc-shaped planar pattern so as to have curvature.

In the modification example of Embodiment 2, the effective channel width W27 of the first level shifter 10a is less than the width (drain width) W28 of the first drain region 7a. The effective channel width W27 is defined by the arc length of the portion in which the first gate electrode 9a and the base region 3 overlap, where an inversion channel forms directly beneath the first gate electrode (control electrode) 9a. The drain width W28 is defined by the arc length of the first drain region 7a.

The configuration of the second level shifter 10b illustrated near the lower right of FIG. 15 is the same as the configuration of the first level shifter 10a and therefore will not be described again here. The rest of the configuration of the semiconductor integrated circuit according to the modification example of Embodiment 2 is the same as the rest of the configuration of the semiconductor integrated circuit according to Embodiment 2 and therefore will not be described again.

Similar to the semiconductor integrated circuit according to Embodiment 2, the semiconductor integrated circuit according to the modification example of Embodiment 2 makes it possible to improve the trade-off between heat generation and propagation delay time in the first level shifter 10a and the second level shifter 10b. Moreover, forming the first level shifter 10a and the second level shifter 10b at corners formed by the HVJT structure 102 of the high-side circuit portion 100 makes the current distribution uniform and makes it possible to prevent damage resulting from current concentration. Furthermore, a third level shifter and a fourth level shifter which are similar to the first level shifter 10a and the second level shifter 10b may be added, and this total of four level shifters may be respectively formed at the four corners formed by the HVJT structure 102 of the high-side circuit portion 100.

OTHER EMBODIMENTS

Although the present invention was described above with reference to Embodiments 1 and 2, the descriptions and drawings of this disclosure should not be understood to limit the present invention in any way. Various alternative embodiments, working examples, and applied technologies will be apparent to a person skilled in the art based on this disclosure.

For example, although Embodiments 1 and 2 above focused primarily on describing examples in which two level shifters (the first level shifter 10a and the second level shifter 10b) were included or four level shifters (the first level shifter 10a, the second level shifter 10b, the third level shifter 10c, and the fourth level shifter 10d) were included, any configuration in which the number of level shifters is at least one is possible, and the number of level shifters may be three or may be five or more. In the present specification, use of the term "level shifter" by itself is a general concept referring collectively to the first level shifter 10a, the second level shifter 10b, the third level shifter 10c, the fourth level shifter 10d, and the like.

Moreover, although in Embodiments 1 and 2 of the present invention semiconductor integrated circuits in which a silicon (Si) substrate was used for the substrate 1 were described, this is only an example. The technical concepts described in Embodiments 1 and 2 of the present invention are also applicable to semiconductor integrated circuits which use a compound semiconductor such as gallium arsenide (GaAs). Furthermore, the technical concepts described in Embodiments 1 and 2 of the present invention can also be applied to semiconductor integrated circuits which use a wide-bandgap semiconductor such as SiC, gallium nitride (GaN), or diamond. In addition, these technical concepts can also be applied to semiconductor integrated circuits which use a narrow-gap semiconductor such as indium antimonide (InSb) or a semimetal or the like.

Upon understanding the key technical details disclosed above in Embodiments 1 and 2, it will be apparent to a person skilled in the art that various alternative embodiments, working examples, and applied technologies can be included within the present invention. Moreover, the present invention includes various other embodiments and the like that are not explicitly described here, such as configurations achieved by freely applying aspects of the embodiments and modification examples described above. Accordingly, the technical scope of the present invention is defined only by the characterizing features of the invention as set forth in the claims, which are appropriately derived from the exemplary descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor integrated circuit, comprising:
   a high-side circuit region;
   a high-voltage junction termination structure formed in a ring shape in an area surrounding the high-side circuit region in a plan view;
   a level shifter formed in a portion of the high-voltage junction termination structure; and
   an isolation region that is formed surrounding a periphery of the level shifter and that electrically isolates the high-side circuit region from the level shifter,
   wherein the level shifter includes:
      a base region of a first conductivity type formed in an upper portion of a semiconductor substrate of the first conductivity type, an impurity concentration of the base region being higher than that of the substrate;
      a first main electrode contact region of a second conductivity type formed contacting the base region in an upper portion of the substrate, the second conductivity type being different from the first conductivity type;
      a drift region of the second conductivity type formed contacting the base region in an upper portion of the substrate at a side opposite to a side of the first main electrode contact region in the plan view;
      a second main electrode contact region of the second conductivity type formed in an upper portion of the drift region, the second main electrode contact region being positioned facing the first main electrode contact region in the plan view; and
      a control electrode arranged over the base region at a position between the first and second main electrode contact regions in the plan view, so as to control a surface potential of the base region underneath, and
   wherein in the plan view, an effective channel width defined by a length of the base region that is directly under the control electrode, as measured along a line perpendicular to a channel current direction, is greater than a width of the second main electrode contact region as measured along a line parallel to said line along which the effective channel width is defined.

2. The semiconductor integrated circuit according to claim 1, wherein a planar shape of the drift region is a trapezoidal shape in which a base adjacent to the first main electrode contact region is longer than a base adjacent to the second main electrode contact region.

3. The semiconductor integrated circuit according to claim 1,
   wherein in the plan view, the high-voltage junction termination structure has a corner, and
   wherein the level shifter is formed at the corner, and in the plan view, the control electrode and the second main electrode contact region respectively have curved bar shapes, and the control electrode is positioned on an outer peripheral side of an arc forming the curved bar shape of the second main electrode contact region.

4. The semiconductor integrated circuit according to claim 3, wherein the effective channel width and the width of the second main electrode contact region are respectively measured along arcs that respectively form the curved bar shapes of the control electrode and the second main electrode contact region.

5. The semiconductor integrated circuit according to claim 1, wherein the drift region is surrounded by the isolation region in the plan view.

6. The semiconductor integrated circuit according to claim 1, wherein the level shifter is provided in a plurality, and the plurality of level shifters are arranged at line-symmetric positions so as to face one another in the plan view.

7. The semiconductor integrated circuit according to claim 1, wherein the level shifter is provided in a plurality, and the plurality of level shifters are arranged at point-symmetric positions so as to face one another in the plan view.

8. A semiconductor integrated circuit, comprising:
   a high-side circuit region;
   a high-voltage junction termination structure formed in a ring shape in an area surrounding the high-side circuit region in a plan view;
   a level shifter formed in a portion of the high-voltage junction termination structure; and
   an isolation region that is formed surrounding a periphery of the high-side circuit region and that electrically isolates the high-side circuit region from the level shifter,
   wherein the level shifter includes:
      a base region of a first conductivity type formed in an upper portion of a semiconductor substrate of the first conductivity type, an impurity concentration of the base region being higher than that of the substrate;
      a first main electrode contact region of a second conductivity type formed contacting the base region in an upper portion of the substrate, the second conductivity type being different from the first conductivity type;
      a drift region of the second conductivity type formed contacting the base region in an upper portion of the substrate at a side opposite to a side of the first main electrode contact region in the plan view;
      a second main electrode contact region of the second conductivity type formed in an upper portion of the drift region, the second main electrode contact region being positioned facing the first main electrode contact region in the plan view; and a control electrode arranged over the base region, at a position between the first and second main electrode contact regions in the plan view, so as to control a surface potential of the base region underneath, and wherein in the plan view, an effective channel width defined by a length of the base region that is directly under the control electrode, as measured along a line perpendicular to a channel current direction, is less than a width of the second main electrode contact region as measured along a line parallel to said line along which the effective channel width is defined.

9. The semiconductor integrated circuit according to claim 8, wherein a planar shape of the drift region is a trapezoidal shape in which a base adjacent to the first main electrode contact region is shorter than a base adjacent to second main electrode contact.

10. The semiconductor integrated circuit according to claim 8, wherein in the plan view, the high-voltage junction termination structure has a corner, and wherein the level shifter is formed at the corner, and in the plan view, the control electrode and the second main electrode contact region respectively have curved bar shapes, and the second main electrode contact region is positioned on an outer peripheral side of an arc forming the curved bar shape of the control electrode.

11. The semiconductor integrated circuit according to claim 10, wherein the effective channel width and the width of the second main electrode contact region are measured along arcs that respectively form the curved bar shapes of the control electrode and the second main electrode contact region.

12. The semiconductor integrated circuit according to claim 8, wherein the drift region is a portion of a well region of the second conductivity type that is formed in the substrate, the well region extending along the isolation region that surrounds the periphery of the high-side circuit region beyond a region where the level shifter is formed in the plan view.

13. The semiconductor integrated circuit according to claim 8, wherein the level shifter is provided in a plurality, and the plurality of level shifters are arranged at line-symmetric positions so as to face one another in the plan view.

14. The semiconductor integrated circuit according to claim 8, wherein the level shifter is provided in a plurality, and the plurality of level shifters are arranged at point-symmetric positions so as to face one another in the plan view.

* * * * *